United States Patent
Ayyapureddi

(10) Patent No.: US 11,309,010 B2
(45) Date of Patent: Apr. 19, 2022

(54) APPARATUSES, SYSTEMS, AND METHODS FOR MEMORY DIRECTED ACCESS PAUSE

(71) Applicant: MICRON TECHNOLOGY, INC., Boise, ID (US)

(72) Inventor: Sujeet Ayyapureddi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/994,338

(22) Filed: Aug. 14, 2020

(65) Prior Publication Data

US 2022/0051716 A1  Feb. 17, 2022

(51) Int. Cl.
  *G11C 11/40*  (2006.01)
  *G11C 11/406*  (2006.01)
  *G11C 11/408*  (2006.01)
  *G06F 13/16*  (2006.01)
  *G11C 11/4078*  (2006.01)

(52) U.S. Cl.
  CPC .... *G11C 11/40611* (2013.01); *G06F 13/1636* (2013.01); *G06F 13/1668* (2013.01); *G11C 11/408* (2013.01); *G11C 11/4078* (2013.01)

(58) Field of Classification Search
  CPC ............. G11C 11/40611; G11C 11/408; G11C 11/4078; G06F 13/1636; G06F 13/1668
  See application file for complete search history.

(56) References Cited

U.S. PATENT DOCUMENTS

| | | | |
|---|---|---|---|
| 5,299,159 A | 3/1994 | Balistreri et al. | |
| 5,654,929 A | 8/1997 | Mote, Jr. | |
| 5,699,297 A | 12/1997 | Yamazaki et al. | |
| 5,867,442 A | 2/1999 | Kim et al. | |
| 5,933,377 A | 8/1999 | Hidaka | |
| 5,943,283 A | 8/1999 | Wong et al. | |

(Continued)

FOREIGN PATENT DOCUMENTS

| CN | 101038785 A | 9/2007 |
|---|---|---|
| CN | 101067972 A | 11/2007 |

(Continued)

OTHER PUBLICATIONS

International Application No. PCT/US20/23689, titled "Semiconductor Device Having Cam That Stores Address Signals", dated Mar. 19, 2020, pp. all.

(Continued)

*Primary Examiner* — Ajay Ojha
(74) *Attorney, Agent, or Firm* — Dorsey & Whitney LLP

(57) ABSTRACT

Apparatuses, systems, and methods for a memory-directed access pause. A controller may perform access operations on a memory by providing commands and addresses. The memory may monitor the addresses to determine if one or more forms of attack (deliberate or inadvertent) is occurring. If an attack is detected, the memory may issue an alert signal (e.g., along an alert bus) and also provide pause data (e.g., along a data bus). The pause data may specify a length of time, and responsive to the alert and the pause data, the controller may suspend access operations on the memory for the length of time specified in the pause data. The memory may use the time when access operations are paused to refresh itself, for example to heal the damage caused by the attack).

29 Claims, 5 Drawing Sheets

(56) References Cited

U.S. PATENT DOCUMENTS

| | | |
|---|---|---|
| 5,956,288 A | 9/1999 | Bermingham et al. |
| 5,959,923 A | 9/1999 | Matteson et al. |
| 5,970,507 A | 10/1999 | Kato et al. |
| 5,999,471 A | 12/1999 | Choi |
| 6,002,629 A | 12/1999 | Kim et al. |
| 6,011,734 A | 1/2000 | Pappert |
| 6,061,290 A | 5/2000 | Shirley |
| 6,064,621 A | 5/2000 | Tanizaki et al. |
| 6,212,118 B1 | 4/2001 | Fujita |
| 6,306,721 B1 | 10/2001 | Teo et al. |
| 6,310,806 B1 | 10/2001 | Higashi et al. |
| 6,310,814 B1 | 10/2001 | Hampel et al. |
| 6,363,024 B1 | 3/2002 | Fibranz |
| 6,392,952 B1 | 5/2002 | Chen et al. |
| 6,424,582 B1 | 7/2002 | Ooishi |
| 6,434,064 B2 | 8/2002 | Nagai |
| 6,452,868 B1 | 9/2002 | Fister |
| 6,515,928 B2 | 2/2003 | Sato et al. |
| 6,535,950 B1 * | 3/2003 | Funyu .................. G11C 7/1042 365/222 |
| 6,567,340 B1 | 5/2003 | Nataraj et al. |
| 6,950,364 B2 | 9/2005 | Kim |
| 7,002,868 B2 | 2/2006 | Takahashi |
| 7,057,960 B1 | 6/2006 | Fiscus et al. |
| 7,082,070 B2 | 7/2006 | Hong |
| 7,187,607 B2 | 3/2007 | Koshikawa et al. |
| 7,203,113 B2 | 4/2007 | Takahashi et al. |
| 7,203,115 B2 | 4/2007 | Eto et al. |
| 7,209,402 B2 | 4/2007 | Shinozaki et al. |
| 7,215,588 B2 | 5/2007 | Lee |
| 7,444,577 B2 | 10/2008 | Best et al. |
| 7,551,502 B2 | 6/2009 | Dono et al. |
| 7,565,479 B2 | 7/2009 | Best et al. |
| 7,692,993 B2 | 4/2010 | Iida et al. |
| 7,830,742 B2 | 11/2010 | Han |
| 8,174,921 B2 | 5/2012 | Kim et al. |
| 8,400,805 B2 | 3/2013 | Yoko |
| 8,572,423 B1 | 10/2013 | Isachar et al. |
| 8,625,360 B2 | 1/2014 | Iwamoto et al. |
| 8,681,578 B2 | 3/2014 | Narui |
| 8,756,368 B2 | 6/2014 | Best et al. |
| 8,811,100 B2 | 8/2014 | Ku |
| 8,862,973 B2 | 10/2014 | Zimmerman et al. |
| 8,938,573 B2 | 1/2015 | Greenfield et al. |
| 9,032,141 B2 | 5/2015 | Bains et al. |
| 9,047,978 B2 | 6/2015 | Bell et al. |
| 9,076,499 B2 * | 7/2015 | Schoenborn ............ G11C 7/02 |
| 9,087,602 B2 | 7/2015 | Youn et al. |
| 9,117,544 B2 | 8/2015 | Bains et al. |
| 9,123,447 B2 | 9/2015 | Lee et al. |
| 9,153,294 B2 | 10/2015 | Kang |
| 9,190,137 B2 | 11/2015 | Kim et al. |
| 9,190,139 B2 | 11/2015 | Jung et al. |
| 9,236,110 B2 | 1/2016 | Bains |
| 9,251,885 B2 | 2/2016 | Greenfield et al. |
| 9,286,964 B2 | 3/2016 | Halbert et al. |
| 9,299,400 B2 | 3/2016 | Bains et al. |
| 9,311,984 B1 | 4/2016 | Hong et al. |
| 9,311,985 B2 | 4/2016 | Lee et al. |
| 9,324,398 B2 | 4/2016 | Jones et al. |
| 9,384,821 B2 | 7/2016 | Bains et al. |
| 9,390,782 B2 | 7/2016 | Best et al. |
| 9,396,786 B2 | 7/2016 | Yoon et al. |
| 9,406,358 B1 | 8/2016 | Lee |
| 9,412,432 B2 | 8/2016 | Narui et al. |
| 9,418,723 B2 | 8/2016 | Chishti et al. |
| 9,424,907 B2 | 8/2016 | Fujishiro |
| 9,484,079 B2 | 11/2016 | Lee |
| 9,514,850 B2 | 12/2016 | Kim |
| 9,570,143 B2 | 2/2017 | Lim et al. |
| 9,570,201 B2 | 2/2017 | Morgan et al. |
| 9,646,672 B1 | 5/2017 | Kim et al. |
| 9,653,139 B1 | 5/2017 | Park |
| 9,672,889 B2 | 6/2017 | Lee et al. |
| 9,685,240 B1 | 6/2017 | Park |
| 9,691,466 B1 | 6/2017 | Kim |
| 9,697,913 B1 | 7/2017 | Marcello et al. |
| 9,734,887 B1 | 8/2017 | Tavva |
| 9,741,409 B2 | 8/2017 | Jones et al. |
| 9,741,447 B2 | 8/2017 | Akamatsu |
| 9,747,971 B2 | 8/2017 | Bains et al. |
| 9,761,297 B1 | 9/2017 | Tomishima |
| 9,786,351 B2 | 10/2017 | Lee et al. |
| 9,799,391 B1 | 10/2017 | Wei |
| 9,805,782 B1 | 10/2017 | Liou |
| 9,805,783 B2 | 10/2017 | Ito et al. |
| 9,812,185 B2 | 11/2017 | Fisch et al. |
| 9,818,469 B1 | 11/2017 | Kim et al. |
| 9,831,003 B2 | 11/2017 | Sohn et al. |
| 9,865,326 B2 | 1/2018 | Bains et al. |
| 9,865,328 B1 | 1/2018 | Desimone et al. |
| 9,922,694 B2 | 3/2018 | Akamatsu |
| 9,934,143 B2 | 4/2018 | Bains et al. |
| 9,953,696 B2 | 4/2018 | Kim |
| 9,978,430 B2 | 5/2018 | Seo et al. |
| 10,020,045 B2 | 7/2018 | Riho |
| 10,020,046 B1 | 7/2018 | Uemura |
| 10,032,501 B2 | 7/2018 | Ito et al. |
| 10,049,716 B2 * | 8/2018 | Proebsting ............... G11C 7/22 |
| 10,083,737 B2 | 9/2018 | Bains et al. |
| 10,090,038 B2 | 10/2018 | Shin |
| 10,134,461 B2 | 11/2018 | Bell et al. |
| 10,141,042 B1 | 11/2018 | Richter |
| 10,147,472 B2 | 12/2018 | Jones et al. |
| 10,153,031 B2 | 12/2018 | Akamatsu |
| 10,170,174 B1 | 1/2019 | Ito et al. |
| 10,192,608 B2 | 1/2019 | Morgan |
| 10,210,925 B2 | 2/2019 | Bains et al. |
| 10,297,305 B1 | 5/2019 | Moon et al. |
| 10,297,307 B1 | 5/2019 | Raad et al. |
| 10,339,994 B2 | 7/2019 | Ito et al. |
| 10,381,327 B2 | 8/2019 | Ramachandra et al. |
| 10,446,256 B2 | 10/2019 | Ong et al. |
| 10,468,076 B1 | 11/2019 | He et al. |
| 10,490,250 B1 | 11/2019 | Ito et al. |
| 10,490,251 B2 | 11/2019 | Wolff |
| 10,504,577 B1 | 12/2019 | Alzheimer |
| 10,510,396 B1 | 12/2019 | Notani et al. |
| 10,572,377 B1 | 2/2020 | Zhang et al. |
| 10,573,370 B2 | 2/2020 | Ito et al. |
| 10,607,679 B2 | 3/2020 | Nakaoka |
| 10,685,696 B2 | 6/2020 | Brown et al. |
| 10,699,796 B2 | 6/2020 | Benedict et al. |
| 10,790,005 B1 | 9/2020 | He et al. |
| 10,825,505 B2 | 11/2020 | Rehmeyer |
| 10,832,792 B1 | 11/2020 | Penney et al. |
| 10,930,335 B2 | 2/2021 | Bell et al. |
| 10,943,636 B1 | 3/2021 | Wu et al. |
| 10,950,289 B2 | 3/2021 | Ito et al. |
| 10,957,377 B2 | 3/2021 | Noguchi |
| 10,964,378 B2 | 3/2021 | Ayyapureddi et al. |
| 10,978,132 B2 | 4/2021 | Rehmeyer et al. |
| 11,017,833 B2 | 5/2021 | Wu et al. |
| 11,069,393 B2 | 7/2021 | Cowles et al. |
| 11,081,160 B2 | 8/2021 | Ito et al. |
| 2001/0008498 A1 | 7/2001 | Ooishi |
| 2002/0026613 A1 | 2/2002 | Niiro |
| 2002/0181301 A1 | 12/2002 | Takahashi et al. |
| 2002/0191467 A1 | 12/2002 | Matsumoto et al. |
| 2003/0026161 A1 | 2/2003 | Yamaguchi et al. |
| 2003/0063512 A1 | 4/2003 | Takahashi et al. |
| 2003/0067825 A1 | 4/2003 | Shimano et al. |
| 2003/0081483 A1 | 5/2003 | De et al. |
| 2003/0123301 A1 | 7/2003 | Jang et al. |
| 2003/0161208 A1 | 8/2003 | Nakashima et al. |
| 2003/0193829 A1 | 10/2003 | Morgan et al. |
| 2003/0231540 A1 | 12/2003 | Lazar et al. |
| 2004/0004856 A1 | 1/2004 | Sakimura et al. |
| 2004/0008544 A1 | 1/2004 | Shinozaki et al. |
| 2004/0022093 A1 | 2/2004 | Lee |
| 2004/0024955 A1 | 2/2004 | Patel |
| 2004/0114446 A1 | 6/2004 | Takahashi et al. |
| 2004/0130959 A1 | 7/2004 | Kawaguchi |
| 2004/0184323 A1 | 9/2004 | Mori et al. |

(56) References Cited

U.S. PATENT DOCUMENTS

| | | |
|---|---|---|
| 2004/0218431 A1 | 11/2004 | Chung et al. |
| 2005/0002268 A1 | 1/2005 | Otsuka et al. |
| 2005/0041502 A1 | 2/2005 | Perner |
| 2005/0105362 A1 | 5/2005 | Choi et al. |
| 2005/0108460 A1 | 5/2005 | David |
| 2005/0213408 A1 | 9/2005 | Shieh |
| 2005/0243627 A1 | 11/2005 | Lee et al. |
| 2005/0265104 A1 | 12/2005 | Remaklus et al. |
| 2006/0018174 A1 | 1/2006 | Park et al. |
| 2006/0083099 A1 | 4/2006 | Bae et al. |
| 2006/0087903 A1 | 4/2006 | Riho et al. |
| 2006/0104139 A1 | 5/2006 | Hur et al. |
| 2006/0176744 A1 | 8/2006 | Stave |
| 2006/0215474 A1 | 9/2006 | Hokenmaier |
| 2006/0233012 A1 | 10/2006 | Sekiguchi et al. |
| 2006/0262616 A1 | 11/2006 | Chen |
| 2006/0262617 A1 | 11/2006 | Lee |
| 2006/0268643 A1 | 11/2006 | Schreck et al. |
| 2007/0002651 A1 | 1/2007 | Lee |
| 2007/0008799 A1 | 1/2007 | Dono et al. |
| 2007/0014175 A1 | 1/2007 | Min et al. |
| 2007/0028068 A1 | 2/2007 | Golding et al. |
| 2007/0030746 A1 | 2/2007 | Best et al. |
| 2007/0033339 A1 | 2/2007 | Best et al. |
| 2007/0147154 A1 | 6/2007 | Lee |
| 2007/0237016 A1 | 10/2007 | Miyamoto et al. |
| 2007/0263442 A1 | 11/2007 | Cornwell et al. |
| 2007/0297252 A1 | 12/2007 | Singh |
| 2008/0028260 A1 | 1/2008 | Oyagi et al. |
| 2008/0031068 A1 | 2/2008 | Yoo et al. |
| 2008/0126893 A1 | 5/2008 | Harrand et al. |
| 2008/0130394 A1 | 6/2008 | Dono et al. |
| 2008/0181048 A1 | 7/2008 | Han |
| 2008/0212386 A1 | 9/2008 | Riho |
| 2008/0224742 A1 | 9/2008 | Pomichter |
| 2008/0253212 A1 | 10/2008 | Iida et al. |
| 2008/0253213 A1 | 10/2008 | Sato et al. |
| 2008/0266990 A1 | 10/2008 | Loeffler |
| 2008/0270683 A1 | 10/2008 | Barth et al. |
| 2008/0306723 A1 | 12/2008 | De Ambroggi et al. |
| 2008/0316845 A1 | 12/2008 | Wang et al. |
| 2009/0021999 A1 | 1/2009 | Tanimura et al. |
| 2009/0052264 A1 | 2/2009 | Hong et al. |
| 2009/0059641 A1 | 3/2009 | Jeddeloh |
| 2009/0073760 A1 | 3/2009 | Betser et al. |
| 2009/0161468 A1 | 6/2009 | Fujioka |
| 2009/0168571 A1 | 7/2009 | Pyo et al. |
| 2009/0185440 A1 | 7/2009 | Lee |
| 2009/0201752 A1 | 8/2009 | Riho et al. |
| 2009/0228739 A1 | 9/2009 | Cohen et al. |
| 2009/0251971 A1 | 10/2009 | Futatsuyama |
| 2009/0296510 A1 | 12/2009 | Lee et al. |
| 2010/0005217 A1 | 1/2010 | Jeddeloh |
| 2010/0005376 A1 | 1/2010 | Laberge et al. |
| 2010/0061153 A1 | 3/2010 | Yen et al. |
| 2010/0074042 A1 | 3/2010 | Fukuda et al. |
| 2010/0097870 A1 | 4/2010 | Kim et al. |
| 2010/0110809 A1 | 5/2010 | Kobayashi et al. |
| 2010/0110810 A1 | 5/2010 | Kobayashi |
| 2010/0124138 A1 | 5/2010 | Lee et al. |
| 2010/0128547 A1 | 5/2010 | Kagami |
| 2010/0131812 A1 | 5/2010 | Mohammad |
| 2010/0141309 A1 | 6/2010 | Lee |
| 2010/0157693 A1 | 6/2010 | Iwai et al. |
| 2010/0182862 A1 | 7/2010 | Teramoto |
| 2010/0182863 A1 | 7/2010 | Fukiage |
| 2010/0329069 A1 | 12/2010 | Ito et al. |
| 2011/0026290 A1 | 2/2011 | Noda et al. |
| 2011/0055495 A1 | 3/2011 | Remaklus, Jr. et al. |
| 2011/0069572 A1 | 3/2011 | Lee et al. |
| 2011/0122987 A1 | 5/2011 | Neyer |
| 2011/0134715 A1 | 6/2011 | Norman |
| 2011/0216614 A1 | 9/2011 | Hosoe |
| 2011/0225355 A1 | 9/2011 | Kajigaya |
| 2011/0299352 A1 | 12/2011 | Fujishiro et al. |
| 2011/0310648 A1 | 12/2011 | Iwamoto et al. |
| 2012/0014199 A1 | 1/2012 | Narui |
| 2012/0059984 A1 | 3/2012 | Kang et al. |
| 2012/0151131 A1 | 6/2012 | Kilmer et al. |
| 2012/0155173 A1 | 6/2012 | Lee et al. |
| 2012/0155206 A1 | 6/2012 | Kodama et al. |
| 2012/0213021 A1 | 8/2012 | Riho et al. |
| 2012/0254472 A1 | 10/2012 | Ware et al. |
| 2012/0287727 A1 | 11/2012 | Wang |
| 2012/0307582 A1 | 12/2012 | Marumoto et al. |
| 2012/0327734 A1 | 12/2012 | Sato |
| 2013/0003467 A1 | 1/2013 | Klein |
| 2013/0003477 A1 | 1/2013 | Park et al. |
| 2013/0028034 A1 | 1/2013 | Fujisawa |
| 2013/0051157 A1 | 2/2013 | Park |
| 2013/0051171 A1 | 2/2013 | Porter et al. |
| 2013/0077423 A1 | 3/2013 | Lee |
| 2013/0173971 A1 | 7/2013 | Zimmerman |
| 2013/0254475 A1 | 9/2013 | Perego et al. |
| 2013/0279284 A1 | 10/2013 | Jeong |
| 2014/0000670 A1 | 1/2014 | Bains et al. |
| 2014/0006700 A1 | 1/2014 | Schaefer et al. |
| 2014/0006704 A1 | 1/2014 | Greenfield et al. |
| 2014/0013169 A1 | 1/2014 | Kobla et al. |
| 2014/0013185 A1 | 1/2014 | Kobla et al. |
| 2014/0016422 A1 | 1/2014 | Kim et al. |
| 2014/0022858 A1 | 1/2014 | Chen et al. |
| 2014/0043888 A1 | 2/2014 | Chen et al. |
| 2014/0050004 A1 | 2/2014 | Mochida |
| 2014/0078841 A1 | 3/2014 | Chopra |
| 2014/0078842 A1 | 3/2014 | Oh et al. |
| 2014/0089576 A1 | 3/2014 | Bains et al. |
| 2014/0089758 A1 | 3/2014 | Kwok et al. |
| 2014/0095780 A1 | 4/2014 | Bains et al. |
| 2014/0095786 A1 | 4/2014 | Moon et al. |
| 2014/0119091 A1 | 5/2014 | You et al. |
| 2014/0143473 A1 | 5/2014 | Kim et al. |
| 2014/0169114 A1 | 6/2014 | Oh |
| 2014/0177370 A1 | 6/2014 | Halbert et al. |
| 2014/0181453 A1 | 6/2014 | Tayasena et al. |
| 2014/0185403 A1 | 7/2014 | Lai |
| 2014/0189228 A1 | 7/2014 | Greenfield et al. |
| 2014/0219042 A1 | 8/2014 | Yu et al. |
| 2014/0219043 A1 | 8/2014 | Jones et al. |
| 2014/0237307 A1 | 8/2014 | Kobla et al. |
| 2014/0241099 A1 | 8/2014 | Seo et al. |
| 2014/0254298 A1 | 9/2014 | Dally |
| 2014/0281206 A1 | 9/2014 | Crawford et al. |
| 2014/0281207 A1 | 9/2014 | Mandava et al. |
| 2014/0293725 A1 | 10/2014 | Best et al. |
| 2014/0321226 A1 | 10/2014 | Pyeon |
| 2015/0016203 A1 | 1/2015 | Sriramagiri et al. |
| 2015/0049566 A1 | 2/2015 | Lee et al. |
| 2015/0049567 A1 | 2/2015 | Chi |
| 2015/0055420 A1 | 2/2015 | Bell et al. |
| 2015/0078112 A1 | 3/2015 | Huang |
| 2015/0085564 A1 | 3/2015 | Yoon et al. |
| 2015/0089326 A1 | 3/2015 | Joo et al. |
| 2015/0092508 A1 | 4/2015 | Bains |
| 2015/0109871 A1 | 4/2015 | Bains et al. |
| 2015/0120999 A1 | 4/2015 | Kim et al. |
| 2015/0134897 A1 | 5/2015 | Sriramagiri et al. |
| 2015/0162064 A1 | 6/2015 | Oh et al. |
| 2015/0162067 A1 | 6/2015 | Kim et al. |
| 2015/0170728 A1 | 6/2015 | Jung et al. |
| 2015/0199126 A1 | 7/2015 | Jayasena et al. |
| 2015/0206572 A1 | 7/2015 | Lim et al. |
| 2015/0213872 A1 | 7/2015 | Mazumder et al. |
| 2015/0243339 A1 | 8/2015 | Bell et al. |
| 2015/0255140 A1 | 9/2015 | Song |
| 2015/0279442 A1 | 10/2015 | Hwang |
| 2015/0294711 A1 | 10/2015 | Gaither et al. |
| 2015/0340077 A1 | 11/2015 | Akamatsu |
| 2015/0356048 A1 | 12/2015 | King |
| 2015/0380073 A1 | 12/2015 | Joo et al. |
| 2016/0019940 A1 | 1/2016 | Jang et al. |
| 2016/0027498 A1 | 1/2016 | Ware et al. |
| 2016/0027531 A1 | 1/2016 | Jones et al. |
| 2016/0027532 A1 | 1/2016 | Kim |

(56) References Cited

U.S. PATENT DOCUMENTS

| | | |
|---|---|---|
| 2016/0042782 A1 | 2/2016 | Narui et al. |
| 2016/0070483 A1 | 3/2016 | Yoon et al. |
| 2016/0078846 A1 | 3/2016 | Liu et al. |
| 2016/0078911 A1 | 3/2016 | Fujiwara et al. |
| 2016/0086649 A1 | 3/2016 | Hong et al. |
| 2016/0093402 A1 | 3/2016 | Kitagawa et al. |
| 2016/0125931 A1 | 5/2016 | Doo et al. |
| 2016/0133314 A1 | 5/2016 | Hwang et al. |
| 2016/0155491 A1 | 6/2016 | Roberts et al. |
| 2016/0180917 A1 | 6/2016 | Chishti et al. |
| 2016/0180921 A1 | 6/2016 | Jeong |
| 2016/0196863 A1 | 7/2016 | Shin et al. |
| 2016/0202926 A1 | 7/2016 | Benedict |
| 2016/0225433 A1 | 8/2016 | Bains et al. |
| 2016/0336060 A1 | 11/2016 | Shin |
| 2016/0343423 A1 | 11/2016 | Shido |
| 2017/0011792 A1 | 1/2017 | Oh et al. |
| 2017/0052722 A1 | 2/2017 | Ware et al. |
| 2017/0076779 A1 | 3/2017 | Bains et al. |
| 2017/0092350 A1 | 3/2017 | Halbert et al. |
| 2017/0111792 A1 | 4/2017 | Correia Fernandes et al. |
| 2017/0133085 A1 | 5/2017 | Kim et al. |
| 2017/0133108 A1 | 5/2017 | Lee et al. |
| 2017/0140807 A1 | 5/2017 | Sun et al. |
| 2017/0140810 A1 | 5/2017 | Choi et al. |
| 2017/0140811 A1 | 5/2017 | Joo |
| 2017/0146598 A1 | 5/2017 | Kim et al. |
| 2017/0148504 A1 | 5/2017 | Saifuddin et al. |
| 2017/0177246 A1 | 6/2017 | Miller et al. |
| 2017/0186481 A1 | 6/2017 | Oh et al. |
| 2017/0213586 A1 | 7/2017 | Kang et al. |
| 2017/0221546 A1 | 8/2017 | Loh et al. |
| 2017/0263305 A1 | 9/2017 | Cho |
| 2017/0269861 A1 | 9/2017 | Lu et al. |
| 2017/0287547 A1 | 10/2017 | Ito et al. |
| 2017/0323675 A1 | 11/2017 | Jones et al. |
| 2017/0345482 A1 | 11/2017 | Balakrishnan |
| 2017/0352404 A1 | 12/2017 | Lee et al. |
| 2018/0005690 A1 | 1/2018 | Morgan et al. |
| 2018/0025770 A1 | 1/2018 | Ito et al. |
| 2018/0025772 A1 | 1/2018 | Lee et al. |
| 2018/0025773 A1 | 1/2018 | Bains et al. |
| 2018/0033479 A1 | 2/2018 | Lea et al. |
| 2018/0047110 A1 | 2/2018 | Blackman et al. |
| 2018/0061476 A1 | 3/2018 | Kim |
| 2018/0061483 A1 | 3/2018 | Morgan |
| 2018/0061485 A1 | 3/2018 | Joo |
| 2018/0075927 A1 | 3/2018 | Jeong et al. |
| 2018/0082737 A1 | 3/2018 | Lee |
| 2018/0096719 A1 | 4/2018 | Tomishima et al. |
| 2018/0102776 A1 | 4/2018 | Chandrasekar et al. |
| 2018/0107417 A1 | 4/2018 | Shechter et al. |
| 2018/0108401 A1 | 4/2018 | Choi et al. |
| 2018/0114561 A1 | 4/2018 | Fisch et al. |
| 2018/0114565 A1 | 4/2018 | Lee |
| 2018/0122454 A1 | 5/2018 | Lee et al. |
| 2018/0130506 A1 | 5/2018 | Kang et al. |
| 2018/0137005 A1 | 5/2018 | Wu et al. |
| 2018/0158504 A1 | 6/2018 | Akamatsu |
| 2018/0158507 A1 | 6/2018 | Bang |
| 2018/0182445 A1 | 6/2018 | Lee et al. |
| 2018/0190340 A1 | 7/2018 | Kim et al. |
| 2018/0218767 A1 | 8/2018 | Wolff |
| 2018/0226119 A1 | 8/2018 | Kim et al. |
| 2018/0233197 A1 | 8/2018 | Laurent |
| 2018/0240511 A1 | 8/2018 | Yoshida et al. |
| 2018/0247876 A1 | 8/2018 | Kim et al. |
| 2018/0254078 A1 | 9/2018 | We et al. |
| 2018/0261268 A1 | 9/2018 | Hyun et al. |
| 2018/0276150 A1 | 9/2018 | Eckert et al. |
| 2018/0285007 A1 | 10/2018 | Franklin et al. |
| 2018/0294028 A1 | 10/2018 | Lee et al. |
| 2018/0308539 A1 | 10/2018 | Ito et al. |
| 2018/0341553 A1 | 11/2018 | Koudele et al. |
| 2019/0013059 A1 | 1/2019 | Akamatsu |
| 2019/0043558 A1 | 2/2019 | Suh et al. |
| 2019/0051344 A1 | 2/2019 | Bell et al. |
| 2019/0065087 A1 | 2/2019 | Li et al. |
| 2019/0066759 A1 | 2/2019 | Naie |
| 2019/0066766 A1 | 2/2019 | Lee |
| 2019/0088315 A1 | 3/2019 | Saenz et al. |
| 2019/0088316 A1 | 3/2019 | Inuzuka et al. |
| 2019/0103147 A1 | 4/2019 | Jones et al. |
| 2019/0115069 A1 | 4/2019 | Lai |
| 2019/0122723 A1 | 4/2019 | Ito et al. |
| 2019/0129651 A1 | 5/2019 | Wuu et al. |
| 2019/0130960 A1 | 5/2019 | Kim |
| 2019/0130961 A1 | 5/2019 | Bell et al. |
| 2019/0147964 A1 | 5/2019 | Yun et al. |
| 2019/0161341 A1 | 5/2019 | Howe |
| 2019/0190341 A1 | 6/2019 | Beisele et al. |
| 2019/0196730 A1 | 6/2019 | Imran |
| 2019/0198078 A1 | 6/2019 | Hoang et al. |
| 2019/0198099 A1 | 6/2019 | Mirichigni et al. |
| 2019/0205253 A1 | 7/2019 | Roberts |
| 2019/0228810 A1 | 7/2019 | Jones et al. |
| 2019/0228815 A1 | 7/2019 | Morohashi et al. |
| 2019/0252020 A1 | 8/2019 | Rios et al. |
| 2019/0267077 A1 | 8/2019 | Ito et al. |
| 2019/0279706 A1 | 9/2019 | Kim |
| 2019/0294348 A1 | 9/2019 | Ware et al. |
| 2019/0333573 A1 | 10/2019 | Shin et al. |
| 2019/0348100 A1 | 11/2019 | Smith et al. |
| 2019/0348102 A1 | 11/2019 | Smith et al. |
| 2019/0348103 A1 | 11/2019 | Jeong et al. |
| 2019/0362774 A1 | 11/2019 | Kuramori et al. |
| 2019/0385661 A1 | 12/2019 | Koo et al. |
| 2019/0385667 A1 | 12/2019 | Morohashi et al. |
| 2019/0385668 A1 | 12/2019 | Fujioka et al. |
| 2019/0385670 A1 | 12/2019 | Notani et al. |
| 2019/0386557 A1 | 12/2019 | Wang et al. |
| 2019/0391760 A1 | 12/2019 | Miura et al. |
| 2019/0392886 A1 | 12/2019 | Cox et al. |
| 2020/0005857 A1 | 1/2020 | Ito et al. |
| 2020/0051616 A1 | 2/2020 | Cho |
| 2020/0075086 A1 | 3/2020 | Hou et al. |
| 2020/0082873 A1 | 3/2020 | Wolff |
| 2020/0126611 A1 | 4/2020 | Riho et al. |
| 2020/0135263 A1 | 4/2020 | Brown et al. |
| 2020/0143871 A1 | 5/2020 | Kim et al. |
| 2020/0176050 A1 | 6/2020 | Ito et al. |
| 2020/0185026 A1 | 6/2020 | Yun et al. |
| 2020/0194056 A1 | 6/2020 | Sakurai et al. |
| 2020/0202921 A1 | 6/2020 | Morohashi et al. |
| 2020/0210278 A1 | 7/2020 | Rooney et al. |
| 2020/0211632 A1 | 7/2020 | Noguchi |
| 2020/0211633 A1 | 7/2020 | Okuma |
| 2020/0211634 A1 | 7/2020 | Ishikawa et al. |
| 2020/0219555 A1 | 7/2020 | Rehmeyer |
| 2020/0219556 A1 | 7/2020 | Ishikawa et al. |
| 2020/0265888 A1 | 8/2020 | Ito et al. |
| 2020/0273517 A1 | 8/2020 | Yamamoto |
| 2020/0273518 A1 | 8/2020 | Raad et al. |
| 2020/0279599 A1 | 9/2020 | Ware et al. |
| 2020/0294569 A1 | 9/2020 | Wu et al. |
| 2020/0294576 A1 | 9/2020 | Brown et al. |
| 2020/0321049 A1 | 10/2020 | Meier et al. |
| 2020/0381040 A1 | 12/2020 | Penney et al. |
| 2020/0388324 A1 | 12/2020 | Rehmeyer et al. |
| 2020/0388325 A1 | 12/2020 | Cowles et al. |
| 2020/0395063 A1 | 12/2020 | Rehmeyer |
| 2021/0057021 A1 | 2/2021 | Wu et al. |
| 2021/0057022 A1 | 2/2021 | Jenkinson et al. |
| 2021/0118491 A1 | 4/2021 | Li et al. |
| 2021/0166752 A1 | 6/2021 | Noguchi |
| 2021/0183433 A1 | 6/2021 | Jenkinson et al. |
| 2021/0183435 A1 | 6/2021 | Meier et al. |
| 2021/0225431 A1 | 7/2021 | Rehmeyer et al. |

(56) References Cited

U.S. PATENT DOCUMENTS

2021/0304813 A1    9/2021    Cowles et al.
2021/0335411 A1    10/2021    Wu et al.

FOREIGN PATENT DOCUMENTS

| | | |
|---|---|---|
| CN | 104350546 A | 2/2015 |
| CN | 106710621 A | 5/2017 |
| CN | 107871516 A | 4/2018 |
| JP | 2005-216429 A | 8/2005 |
| JP | 2011-258259 A | 12/2011 |
| JP | 4911510 B2 | 1/2012 |
| JP | 2013-004158 A | 1/2013 |
| JP | 6281030 B1 | 1/2018 |
| WO | 2014120477 | 8/2014 |
| WO | 2015030991 A1 | 3/2015 |
| WO | 2017171927 A1 | 10/2017 |
| WO | 2019222960 A1 | 11/2019 |
| WO | 2020010010 A1 | 1/2020 |
| WO | 2020117686 A1 | 6/2020 |
| WO | 2020247163 A1 | 12/2020 |
| WO | 2020247639 A1 | 12/2020 |

OTHER PUBLICATIONS

U.S. Appl. No. 16/797,658, titles "Apparatuses and Methods for Controlling Refresh Operations", filed Feb. 21, 2020, pp. all.
U.S. Appl. No. 16/818,981 titled "Apparatuses and Methods for Staggered Timing of Targeted Refresh Operations" filed Mar. 13, 2020, pp. all.
U.S. Appl. No. 16/824,460, titled "Semiconductor Device Performing Row Hammer Refresh Operation", dated Mar. 19, 2020, pp. all.
U.S. Appl. No. 16/025,844, titled "Apparatus and Methods for Triggering Row Hammer Address Sampling", filed Jul. 2, 2018, pp. all.
U.S. Appl. No. 16/783,063, titled "Apparatus and Methods for Triggering Row Hammer Address Sampling", dated Feb. 5, 2020, pp. all.
U.S. Appl. No. 16/805,197, titled "Apparatuses and Methods for Calculating Row Hammer Refresh Addresses in a Semiconductor Device", dated Feb. 28, 2020, pp. all.
U.S. Appl. No. 16/232,837, titled "Apparatuses and Methods for Distributed Targeted Refresh Operations", filed Dec. 26, 2018, pp. all.
U.S. Appl. No. 16/818,989, titled "Semiconductor Device Performing Row Hammer Refresh Operation", dated Mar. 13, 2020, pp. all.
U.S. Appl. No. 16/268,818, titled "Apparatuses and Methods for Managing Row Access Counts", filed Feb. 6, 2019, pp. all.
U.S. Appl. No. 16/286,187 titled "Apparatuses and Methods for Memory Mat Refresh Sequencing" filed Feb. 26, 2019, pp. all.
U.S. Appl. No. 16/084,119, titled "Apparatuses and Methods for Pure-Time, Self Adopt Sampling for Row Hammer Refresh Sampling", filed Sep. 11, 2018, pp. all.
U.S. Appl. No. 16/886,284 titled "Apparatuses and Methods for Access Based Refresh Timing" filed May 28, 2020, pp. all.
U.S. Appl. No. 16/886,284 titled "Apparatuses and Methods for Access Based Refresh Timing", dated May 28, 2020, pp. all.
U.S. Appl. No. 16/358,587, titled "Semiconductor Device Having Cam That Stores Address Signals", dated Mar. 19, 2019, pp. all.
U.S. Appl. No. 16/375,716 titled "Apparatuses and Methods for Staggered Timing of Targeted Refresh Operations" filed Apr. 4, 2019; pp. all.
U.S. Appl. No. 16/411,573 titled "Apparatuses, Systems, and Methods for a Content Addressable Memory Cell" filed May 14, 2019, pp. all.
U.S. Appl. No. 16/428,625 titled "Apparatuses and Methods for Tracking Victim Rows" filed May 31, 2019, pp. all.
U.S. Appl. No. 17/008,396 titled "Apparatuses and Methods for Staggered Timing of Targeted Refresh Operations" filed Aug. 31, 2020, pp. all.
U.S. Appl. No. 16/513,400 titled "Apparatuses and Methods for Tracking Row Accesses" filed Jul. 16, 2019, pp. all.
U.S. Appl. No. 16/548,027 titled "Apparatuses, Systems, and Methods for Analog Row Access Rate Determination" filed Aug. 22, 2019, pp. all.
U.S. Appl. No. 16/549,942 titled "Apparatuses and Methods for Lossy Row Access Counting" filed Aug. 23, 2019, pp. all.
U.S. Appl. No. 16/546,152 titled "Apparatuses and Methods for Analog Row Access Tracking" filed Aug. 20, 2019, pp. all.
U.S. Appl. No. 16/549,411 titled "Apparatuses and Methods for Dynamic Refresh Allocation" filed Aug. 23, 2019, pp. all.
International Application No. PCT/US19/40169 titled "Apparatus and Methods for Triggering Row Hammer Address Sampling" filed Jul. 1, 2019, pp. all.
International Application No. PCT/US19/64028, titled "Semiconductor Device Performing Row Hammer Refresh Operation", dated Dec. 2, 2019, pp. all.
International Application No. PCT/US20/26689, titled "Apparatuses and Methods for Staggered Timing of Targeted Refresh Operations", dated Apr. 3, 2020, pp. all.
PCT Application No. PCT/US20/32931, titled "Apparatuses and Methods for Controlling Steal Rates", dated May 14, 2020, pp. all.
U.S. Appl. No. 16/788,657, titled "Semiconductor Device Performing Row Hammer Refresh Operation", dated Feb. 12, 2020, pp. all.
U.S. Appl. No. 15/881,256 entitled 'Apparatuses and Methods for Detecting a Row Hammer Attack With a Bandpass Filter' filed Jan. 26, 2018, pp. all.
U.S. Appl. No. 16/425,525 titled "Apparatuses and Methods for Tracking All Row Accesses" filed May 29, 2019, pp. all.
U.S. Appl. No. 16/427,105 titled "Apparatuses and Methods for Priority Targeted Refresh Operations" filed May 30, 2019, pp. all.
U.S. Appl. No. 16/427,140 titled "Apparatuses and Methods for Tracking Row Access Counts Between Multiple Register Stacks" filed May 30, 2019, pp. all.
U.S. Appl. No. 16/437,811 titled "Apparatuses, Systems, and Methods for Determining Extremum Numerical Values" filed Jun. 11, 2019, pp. all.
U.S. Appl. No. 16/537,981 titled "Apparatuses and Methods for Controlling Targeted Refresh Rates" filed Aug. 12, 2019, pp. all.
U.S. Appl. No. 16/655,110 titled "Apparatuses and Methods for Dynamic Targeted Refresh Steals" filed Oct. 16, 2019, pp. all.
U.S. Appl. No. 16/997,659 titled "Apparatuses, Systems, and Methods for Refresh Modes" filed Aug. 19, 2020, pp. all.
U.S. Appl. No. 16/997,766 titled "Refresh Logic Circuit Layouts Thereof" filed Aug. 19, 2020, pp. all.
U.S. Appl. No. 17/095,978 titled "Apparatuses and Methods for Controlling Refresh Timing" filed Nov. 12, 2020, pp. all.
U.S. Appl. No. 17/127,654 titled "Apparatuses and Methods for Row Hammer Based Cache Lockdown" filed Dec. 18, 2020, pp. all.
U.S. Appl. No. 17/175,485 titled "Apparatuses and Methods for Distributed Targeted Refresh Operations" filed Feb. 12, 2021, pp. all.
U.S. Appl. No. 17/186,913 titled "Apparatuses and Methods for Dynamic Refresh Allocation" filed Feb. 26, 2021, pp. all.
U.S. Appl. No. 17/187,002 titled "Apparatuses and Methods for Staggered Timing of Targeted Refresh Operations" filed Feb. 26, 2021, pp. all.
U.S. Appl. No. 15/789,897, entitled "Apparatus and Methods for Refreshing Memory", filed Oct. 20, 2017; pp. all.
U.S. Appl. No. 15/796,340, entitled: "Apparatus and Methods for Refreshing Memory" filed Oct. 27, 2017, pp. all.
U.S. Appl. No. 16/012,679, titled "Apparatuses and Methods for Multiple Row Hammer Refresh Address Sequences", filed Jun. 19, 2018, pp. all.
U.S. Appl. No. 16/020,863, titled "Semiconductor Device", filed Jun. 27, 2018, pp. all.
U.S. Appl. No. 16/112,471 titled "Apparatuses and Methods for Controlling Refresh Operations" filed Aug. 24, 2018, pp. all.
U.S. Appl. No. 16/160,801, titled "Apparatuses and Methods for Selective Row Refreshes" filed Oct. 15, 2018, pp. all.
U.S. Appl. No. 16/176,932, titled "Apparatuses and Methods for Access Based Refresh Timing", filed Oct. 31, 2018, pp. all.
U.S. Appl. No. 16/208,217, titled "Semiconductor Device Performing Row Hammer Refresh Operation", filed Dec. 3, 2018, pp. all.

(56) References Cited

OTHER PUBLICATIONS

U.S. Appl. No. 16/230,300, titled "Apparatuses and Methods for Staggered Timing of Targeted Refresh Operations" filed Dec. 21, 2018, pp. all.
U.S. Appl. No. 16/231,327 titled "Apparatuses and Methods for Selective Row Refreshes", filed Dec. 21, 2018, pp. all.
U.S. Appl. No. 16/237,291, titled "Apparatus and Methods for Refreshing Memory", filed Dec. 31, 2018, pp. all.
U.S. Appl. No. 16/290,730, titled "Semiconductor Device Performing Row Hammer Refresh Operation", filed Mar. 1, 2019, pp. all.
U.S. Appl. No. 16/374,623, titled "Semiconductor Device Performing Row Hammer Refresh Operation", filed Apr. 3, 2019, pp. all.
U.S. Appl. No. 16/411,698 title "Semiconductor Device" filed May 14, 2019, pp. all.
U.S. Appl. No. 16/427,330 titled "Apparatuses and Methods for Storing Victim Row Data" filed May 30, 2019, pp. all.
U.S. Appl. No. 16/431,641 titled "Apparatuses and Methods for Controlling Steal Rates" filed Jun. 4, 2019, pp. all.
U.S. Appl. No. 16/682,606, titled "Apparatuses and Methods for Distributing Row Hammer Refresh Events Across a Memory Device", filed Nov. 13, 2019, pp. all.
U.S. Appl. No. 15/876,566 entitled 'Apparatuses and Methods for Calculating Row Hammer Refresh Addresses in a Semiconductor Device' filed Jan. 22, 2018, pp. all.
U.S. Appl. No. 15/656,084, titled "Apparatuses and Methods for Targeted Refreshing of Memory", filed Jul. 21, 2017, pp. all.
U.S. Appl. No. 16/459,520 titled "Apparatuses and Methods for Monitoring Word Line Accesses", filed Jul. 1, 2019, pp. all.
PCT Application No. PCT/US18/55821 "Apparatus and Methods for Refreshing Memory" filed Oct. 15, 2018, pp. all.
U.S. Appl. No. 15/715,846, entitled "Semiconductor Device", filed Sep. 26, 2017, pp. all.
U.S. Appl. No. 15/888,993, entitled "Apparatuses and Methods for Controlling Refresh Operations", filed Feb. 5, 2018, pp. all.
U.S. Appl. No. 16/190,627 titled "Apparatuses and Methods for Targeted Refreshing of Memory" filed Nov. 14, 2018, pp. all.
U.S. Appl. No. 17/030,018, titled "Apparatuses and Methods for Controlling Refresh Operations", filed Sep. 23, 2020, pp. all.
U.S. Appl. No. 15/281,818, entitled: "Semiconductor Device" filed Sep. 30, 2016, pp. all.
Kim, et al., "Flipping Bits in MemoryWithout Accessing Them: An Experimental Study of DRAM Disturbance Errors", IEEE, Jun. 2014, 12 pgs.
U.S. Appl. No. 17/324,621 titled "Apparatuses and Methods for Pure-Time, Self-Adopt Sampling for Row Hammer Refresh Sampling" filed May 19, 2021.
U.S. Appl. No. 17/347,957 titled "Apparatuses and Methods for Controlling Steal Rates" filed Jun. 15, 2021.
U.S. Appl. No. 16/432,604 titled "Apparatuses and Methods for Staggered Timing of Skipped Refresh Operations" filed Jun. 5, 2019, pp. all.
U.S. Appl. No. 17/226,975, titled "Apparatuses and Methods for Staggered Timing of Skipped Refresh Operations" filed Apr. 9, 2021, pp. all.

\* cited by examiner

APPARATUSES, SYSTEMS, AND METHODS FOR MEMORY DIRECTED ACCESS PAUSE

BACKGROUND

Semiconductor devices may include a controller and a memory. The controller may operate the memory, for example by providing commands to the memory and sending and receiving data to and from the memory. The memory may be a volatile memory in which the information stored therein may decay over time. The memory may carry out a self-refresh operation to restore the information before it can decay. Certain patterns of commands sent by the controller may increase the rate at which information decays in the memory. The memory may track access patterns, for example, by tracking commands and/or addresses,

DETAILED DESCRIPTION

Figure 1:
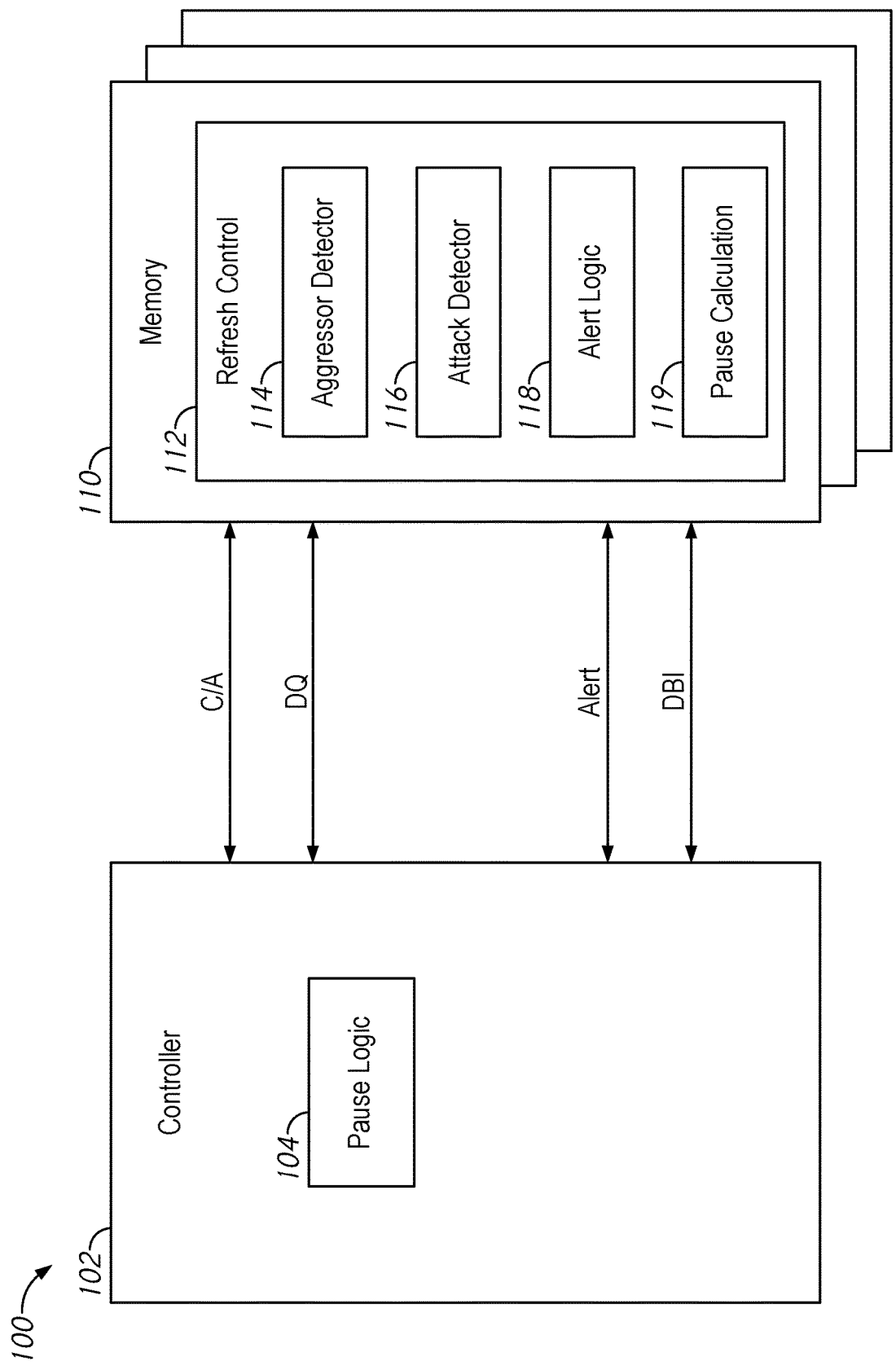
FIG. 1 is a block diagram of a memory system according to some embodiments of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory may be operated by a controller, which may provide various signals to the memory. For example, the controller may perform a read command by provide a read command and addresses along a command/address (CA) bus. The addresses may specify where in the memory array of the memory that the data should be read from. The memory may provide the data from the specified location along a data (DQ) bus. The controller may perform a write operation by providing a write command and addresses along the CA bus, and may receive the read information along the DQ bus.

The memory may store information in memory cells of the memory array, which may be arranged at the intersection of word lines (rows) and bit lines (columns or digit lines). Accordingly, row and column addresses may be used by the controller to specify the location of one or more memory cells. The memory array may be volatile, and the information in the memory cells may decay over time. The memory may refresh information (e.g., on a row-by-row basis) to restore the information before it can decay beyond the point of recovery. Certain patterns of access may increase the rate at which the information decays. For example, repeated access to a given row (an aggressor row) may increase the rate at which information decays in neighboring rows (victim rows). Such a pattern may be referred to as a row hammer. The memory may track accesses in order to identify aggressor rows, such that their victims may be refreshed.

In some circumstances, the controller may inadvertently access the memory in a manner which causes an increased rate of information decay in some cells. In some circumstances, a malicious actor may deliberately attack the memory by instructing the controller to behave in a manner which causes increased rate of data decay, for example as part of an effort to manipulate the data stored in the memory. For brevity, both types of access patters (deliberate and inadvertent) may be referred to as an attack. In these and other circumstances, it may be useful to frustrate the attack by preventing the controller from providing further instructions for a period of time.

The present disclosure is drawn to apparatuses, systems, and methods for a memory directed access pause. During operations, the controller may provide commands and addresses along the CA bus. The memory may monitor the addresses to determine if one or more forms of attack are occurring. If the memory determines an attack is occurring, the memory may provide an alert signal (e.g., along an alert bus) to notify the controller that an attack is occurring. The memory may also provide pause data (e.g., along the DQ bus) which indicates how long the memory would like to be offline for. The controller may suspend access operations to the memory (e.g., by not providing commands and addresses) for a period of time specified by the pause data. The pause may allow the memory to perform refresh operations. The pause may also slow down the rate at which attacks can occur, which may frustrate attackers in situations where the attack is deliberate.

FIG. 1 is a block diagram of a memory system according to some embodiments of the present disclosure. The system 100 includes a controller 102 which may be coupled to one or more memories 110. For example, multiple memories 110 may be packaged together as part of a memory stack. The memories 110 may be coupled to the controller 102 along various buses, each of which may include one or more conductive lines which couple 'pins' of the memories 110 to pins of the controller 102. In some embodiments, the buses may be coupled in common to each of the memories 110. Since the memories 110 may generally be similar to each other, some features and operations may be described with respect to a single memory 110, however these features and operations should be understood to apply to each of the memories 110.

Information may be provided along the buses as voltages. For example, different voltages received at the pins of the controller 102 and memories 110 may represent different logical levels. The buses may use a mix of serial and parallel transmission to convey information. For example, the data bus may include sixteen conductive elements coupled to sixteen pins, each of which may convey eight bits as part of a serial burst information (e.g., for 128 total bits). Other formats of carrying information may be used in other examples.

The controller 102 is coupled to the memories 110 along a command/address bus CA, which carries both commands and addresses from the controller 102 to one or more of the memories 110. The controller 102 is also coupled to the memories 110 along a data bus DQ, which carries data information between the controller 102 and memories 110. For example, the controller 102 may provide a read command along the CA bus, along with one or more addresses, such as a row address, column address, and/or bank address. The addresses may also specify one or more of the memories 110 to activate. Responsive to the read command, the memory may retrieve the information stored in the memory cells specified by the addresses and provide that read information along the DQ bus back to the controller 102.

As part of an example write operation, the controller 102 may provide a write command along the CA bus along with addresses (which may specify one or more of the memories 110). The controller 102 may also provide write data along the DQ bus. The memory may store the write data from the DQ bus into one or more memory cells specified by the addresses. In some example operations, data may be read from (or written to) multiple memories 110 at once. In some example operation, data may be read from (or written to) selected ones of the memories 110.

Each of the memories 110 may include a refresh control circuit 112 which manages refresh operations in the memory. In some embodiments, there may be a refresh control circuit 112 for each bank of the memory. Other organizations of refresh control circuits 112 for different portions of the memory 110 are possible in other embodiments. During normal operations memory may be entered into a refresh mode (e.g., based on logic internal to the memory 110, signals from the controller 102, and combinations thereof). During the refresh mode the refresh control circuit 112 may refresh word lines of the memory to restore information before it can decay. For example, as part of auto-refresh operations the refresh control circuit 112 may generate refresh addresses based on a sequence of addresses. Over time the auto-refresh operations may cycle through all of the word lines of the memory at a rate high enough to prevent information loss.

The refresh control circuit 112 may also target particular word lines for refreshing as part of targeted refresh operations. For example, the refresh control circuit 112 may identify aggressor rows of the memory so that the victim rows associated with the identified aggressors may be refreshed as part of targeted refresh operations. It should be understood that the refresh control circuit 112 may use some criteria to identify aggressors, and that it is not necessary for the identified aggressors to have actually caused increased rates of data decay or for the identified victim rows to actually undergo increased rates of data decay.

The refresh control circuit 112 may include an aggressor detector circuit 114, which may detect aggressor rows based on various criteria. For example, the aggressor detector 114 may count accesses to various row addresses provided along the CA bus. If a given address is accessed a certain number of times (e.g., its access count crosses a threshold) then that address may be identified as an aggressor. The aggressor detector 114 may include various monitoring circuits (e.g., counters, registers, etc.) as well as a refresh queue, which stores identified aggressors until their respective victims can be refreshed.

During an attack on one or more memories 110, word lines which require refreshing may accumulate faster than the memory can refresh them as part of normal refresh operations. To prevent the victims of the excess aggressors from going unrefreshed, the refresh control circuit 110 may include an attack detector 116 which detects one or more types of attack pattern. An example attack pattern may include hammering different rows such that there are too many aggressor rows for the refresh queue to store. Such an attack pattern may be referred to as a queue overflow attack. An example attack may include accessing many rows such that each row is accessed a number of times (or at a rate) just below the threshold at which they would be judged to be aggressors, and then accessing them again rapidly such that a large number of rows are suddenly judged to be aggressors. Such an attack pattern may be referred to as a waterfall attack. The attack detector 116 may use various criteria to identify one or more attack patterns. An example attack detector is described in more detail in FIG. 3.

When the attack detector 116 indicates that one or more attacks is underway, it may signal alert logic 118 of the refresh control circuit 112. The alert logic 118 may signal the controller 102 that the memory 110 (or portion of the memory) is under attack, and provide pause data which indicates how long the controller 102 should suspend access operations on the memory 110 (or portion of the memory). The refresh control circuit 112 may include a pause calculator circuit 119, which may generate the pause data. The pause data may indicate how long the memory 110 wants access operations to be suspended for. The length of time specified in the pause data may depend, in part, on what type of attack was detected by the attack detector 116. For example, the pause data may specify a longer time in response to a detected waterfall attack than it does in response to a refresh queue overflow attack. The pause calculator circuit 119 may receive signals from the attack detector 116 which indicate which type of attack is occurring, and may generate the pause data accordingly. In some embodiments, the pause calculator circuit 119 may also take into account additional factors (e.g., how many attacks have occurred within a given time span) when determining the length of time to specify in the pause data.

The alert signal may be provided along an alert bus, which may be shared by multiple memories. For example, the memories 110 may be coupled to the controller 102 in common by the alert bus. In some embodiments, the alert bus may be a single alert pin, coupled in common to each of the memories 110. Accordingly, the alert signal may be a single binary signal which is either active or inactive. The memory 110 which detected an attack may provide the alert signal at an active level along the alert bus, and may provide identification information so the controller 102 knows which memory is under attack. For example, the memory 110 may use the data bus inversion (DBI) to identify which memory is under attack. Each memory may have a DBI pin associated with that memory. If the memory provides a active signal along its associated DBI pin, the controller may use which of the DBI pins is carrying an active signal to determine which of the memories is requesting a pause in operations.

The controller 102 may include pause logic 104 which may be used to suspend operations to one or more memories (and/or memory portions) responsive to a detected attack. For example, the pause logic 104 may receive the alert signal (and the identification information) which indicates that one of the memories is undergoing an attack. In some embodiments, the alert signal may provide limited information (e.g., in embodiments where it is a single bit, it will not indicate what kind of problem caused the alert). The controller 102 may query the memories 110 for more information, for example by performing a read operation to retrieve information from the memories 110 about the cause of the alert. The pause logic 104 may also cause the controller 102 to query the memories 110 in order to retrieve the pause data. For example the controller 102 may perform a read operation to retrieve the pause data along the DQ bus. In some embodiments, the controller 102 queries may be combined, and the controller 102 may read the pause data as part of asking about whether an attack is occurring.

The pause logic 104 may use the pause data to determine how long to suspend operations to the memory (or portion of the memory). For example the pause data may specify a length of time (e.g., in clock cycles). The pause logic 104 may provide internal signals to the controller 104 which instruct it to not send access commands to the specified memory for at least that length of time. The controller 102 may also have internal logic which may save a state of operations to the memory which is being paused. For example, the controller 102 may save the most recent commands sent to the paused memory, as well as any additional commands which would have been sent during the pause in a queue to provide once the pause has elapsed.

In some embodiments, the memories 110 may take no actions during the pause. In some embodiments, the memories 110 which are paused may enter a self-refresh mode to 'heal' the attack by performing refresh operations. For example, in the case of a refresh queue overflow attack, all of the victims of the aggressors stored in the refresh queue may be refreshed to empty the queue. In the case of a waterfall attack, the memory may refresh the victims of all wordlines which are close to being detected as aggressors. In some embodiments, the memory may perform other refresh patterns, such as refreshing all wordlines. The length of time specified in the pause data may be based in part, on how long the memory anticipates taking to perform these refresh operations.

Figure 2:
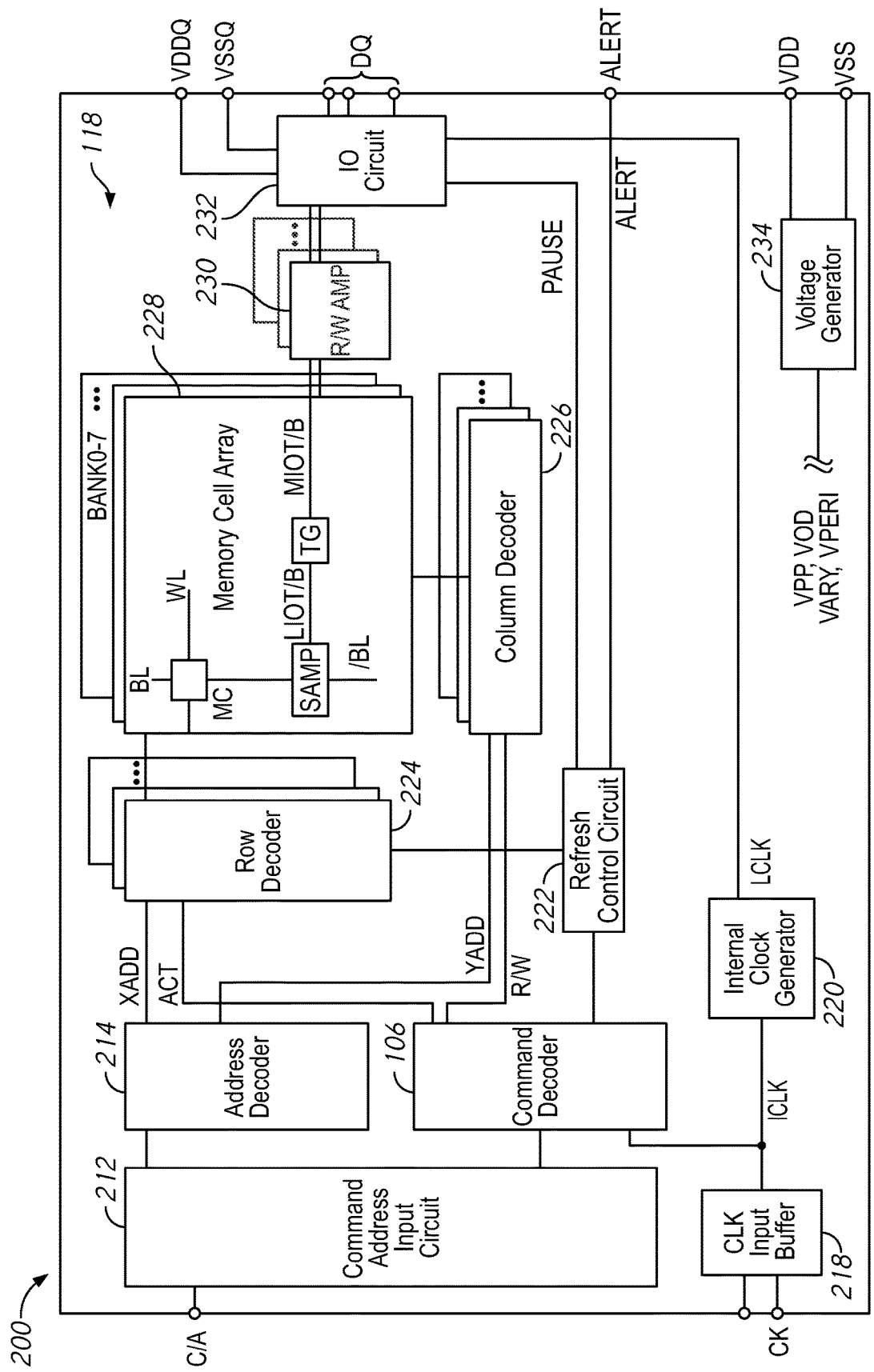
FIG. 2 is a block diagram of an apparatus according to an embodiment of the disclosure.

FIG. 2 is a block diagram of an apparatus according to an embodiment of the disclosure. The apparatus may be a semiconductor device 200, and will be referred to as such. The device 200 may be included in the memory 120 of FIG. 1. In some embodiments, the semiconductor device 200 may include, without limitation, a DRAM device.

The semiconductor device 200 includes a memory array 228. The memory array 228 is shown as including a plurality of memory banks. In the embodiment of FIG. 2, the memory array 228 is shown as including eight memory banks BANK0-BANK7. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 224 and the selection of the bit lines BL and /BL is performed by a column decoder 226. In the embodiment of FIG. 2, the row decoder 224 includes a respective row decoder for each memory bank and the column decoder 226 includes a respective column decoder for each memory bank. The bit lines BL and /BL are coupled to a respective sense amplifier (SAMP). Read data from the bit line BL or /BL is amplified by the sense amplifier SAMP, and transferred to read/write amplifiers 230 over complementary local data lines (LIOT/B), transfer gate (TG), and complementary main data lines (MIOT/B). Conversely, write data outputted from the read/write amplifiers 230 is transferred to the sense amplifier SAMP over the complementary main data lines MIOT/B, the transfer gate TG, and the complementary local data lines LIOT/B, and written in the memory cell MC coupled to the bit line BL or /BL.

The semiconductor device 200 may employ a plurality of external terminals that include command and address (CA) terminals coupled to a command and address bus (e.g., 110 of FIG. 1) to receive commands and addresses, and clock terminals to receive clock signals CK_t and CK_c, and data clock signals WCK_t and WCK_c, and to provide access data clock signals RDQS_t and RDQS_c, data terminals DQ and DM, alert terminal ALERT to send/receive an alert signal, and power supply terminals to receive power supply potentials VDD, VSS, VDDQ, and VSSQ. The various terminals of the device 200 may generally be referred to as 'pins' and may be coupled to conductive elements which carry the signals to the pins. For example, there may be a number of CA pins, each of which may receive signals as voltages. Each CA pin may receive signals in a series format, with the voltage level varying over time to indicate different logic levels.

The clock terminals are supplied with external clock signals CK_t and CK_c that are provided to an input buffer 218. The external clock signals may be complementary. The input buffer 218 generates an internal clock ICLK based on the CK_t and CK_c clock signals. The ICLK clock is provided to the command decoder 216 and to an internal clock generator 220. The internal clock generator 220 provides various internal clock signals LCLK based on the ICLK clock. The LCLK clock signals may be used for timing operation of various internal circuits. In some embodiments, data clocks (not shown) may also be provided to control the operation of data being written to/read from the device 200.

The CA terminals may be supplied with memory addresses. The memory addresses supplied to the CA terminals are transferred, via a command/address input circuit 212, to an address decoder 214. The address decoder 214 receives the address and supplies a decoded row address XADD to the row decoder 224 and supplies a decoded column address YADD to the column decoder 226. The CA terminals may be supplied with commands. Examples of commands include timing commands for controlling the timing of various operations, access commands for accessing the memory, such as read commands for performing read operations and write commands for performing write operations, mode register write and read commands for performing mode register write and read operations, as well as other commands and operations.

The commands may be provided as internal command signals to a command decoder 216 via the command/address input circuit 212. The command decoder 216 includes circuits to decode the internal command signals to generate various internal signals and commands for performing operations. For example, the command decoder 216 may provide a row command signal ACT to select a word line and a column command signal R/W to select a bit line.

When a read command is received, and a row address and a column address are timely supplied with the read command, read data is read from memory cells in the memory array 228 corresponding to the row address and column address. The read command is received by the command decoder 244, which provides internal commands so that read data from the memory array 228 is provided to the read/write amplifiers 230. The read data is output to outside from the data terminals DQ via the input/output circuit 232.

When the write command is received, and a row address and a column address are timely supplied with the write command, write data supplied to the data terminals DQ is written to a memory cells in the memory array 228 corresponding to the row address and column address. A data mask may be provided to the data terminals DM to mask portions of the data when written to memory. The write command is received by the command decoder 244, which provides internal commands so that the write data is received by data receivers in the input/output circuit 232. The write data is supplied via the input/output circuit 232 to the read/write amplifiers 230, and by the read/write amplifiers 230 to the memory array 228 to be written into the memory cell MC.

The refresh control circuit 222 may receive a refresh signal AREF. The memory may be entered into a self-refresh mode by an external signal, such as an external refresh signal or a command entering the memory device 200 into a replacement mode. Once in a self-refresh mode, the memory 200 may generate activations (e.g., pulses) of the refresh signal AREF. Responsive to each activation of the refresh signal AREF, the memory may refresh one or more word lines. For example, responsive to an activation of AREF, the refresh control circuit 222 may provide a number of 'pumps' each of which may be associated with one or more refresh addresses. The refresh addresses may be provided to the row decoder 224, which may refresh the word lines. The signal AREF may continue to be periodically generated until the memory exits the self-refresh mode (e.g., responsive to a replacement mode exit command). The refresh control circuit 222 may use internal logic to generate the refresh addresses. For example the refresh control circuit 222 may have a sequence generator which provides a refresh address from a sequence of refresh addresses.

In some embodiments, the refresh control circuit 222 may additionally identify memory cells which are at risk of a faster rate of memory decay and refresh them out of sequence. For example, repeated accesses to a given row (a 'row hammer') may cause nearby rows to experience faster information decay. The refresh control circuit 222 may identify these victim rows (e.g., based on access patterns) and refresh them as part of a targeted refresh. In some embodiments, the refresh control circuit 222 may mix refreshing rows in sequence and targeted refreshes.

The refresh control circuit 222 may also monitor the state of the commands and accesses to determine if an attack is occurring. For example, the refresh control circuit 222 may monitor a number (or rate) of rows which have been hammered, or which are close to being hammered to determine if one or more types of attack is occurring. If the refresh control circuit 222 determines that an attack is occurring, it may provide pause data PAUSE and an alert signal ALERT at an active level. The pause data PAUSE may be provided to the IO circuit 232 and may then be provided along the data terminals DQ. The alert signal may be provided to an ALERT pin.

The pause data may be a number which represents a length of time the memory wants to be offline for. For example the pause data may be a binary number which specifies a number of clock cycles. Responsive to providing the alert signal ALERT and pause data PAUSE, the memory may be entered into a self-refresh mode. In some embodiments, the controller may provide signals entering the memory 200 into the self-refresh mode. In some embodiments, the memory 200 may enter itself into the self-refresh mode. During the self-refresh mode, the refresh control circuit 222 may perform refresh operations based on the type of attack which was detected.

In some embodiments, the refresh control circuit may be repeated on a bank-by-bank basis, and accordingly the refresh control circuits 222 may determine if an attack is occurring on a bank-by-bank basis. Accordingly, responsive to an attack being detected, the bank which is under attack may have its access operations suspended and may be entered into a self-refresh mode, while other banks may continue to receive access operations as normal. Other subdivisions (e.g., section-by-section, mat-by-mat) of the memory attack monitoring and refreshing may be used in other examples. In embodiments where only a portion of the memory 200 has its access operations suspended, the memory may provide identification information (e.g., along with the PAUSE data) which indicates which portion(s) of the memory are under attack.

The power supply terminals are supplied with power supply potentials VDD and VSS. The power supply potentials VDD and VSS are supplied to an internal voltage generator circuit 234. The internal voltage generator circuit 234 generates various internal potentials VPP, VOD, VARY, VTARGET, VPERI, and the like based on the power supply potentials VDD and VSS supplied to the power supply terminals.

The power supply terminals are also supplied with power supply potentials VDDQ and VSSQ. The power supply potentials VDDQ and VSSQ are supplied to the input/output circuit 232. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 232 so that power supply noise generated by the input/output circuit 232 does not propagate to the other circuit blocks.

Figure 3:
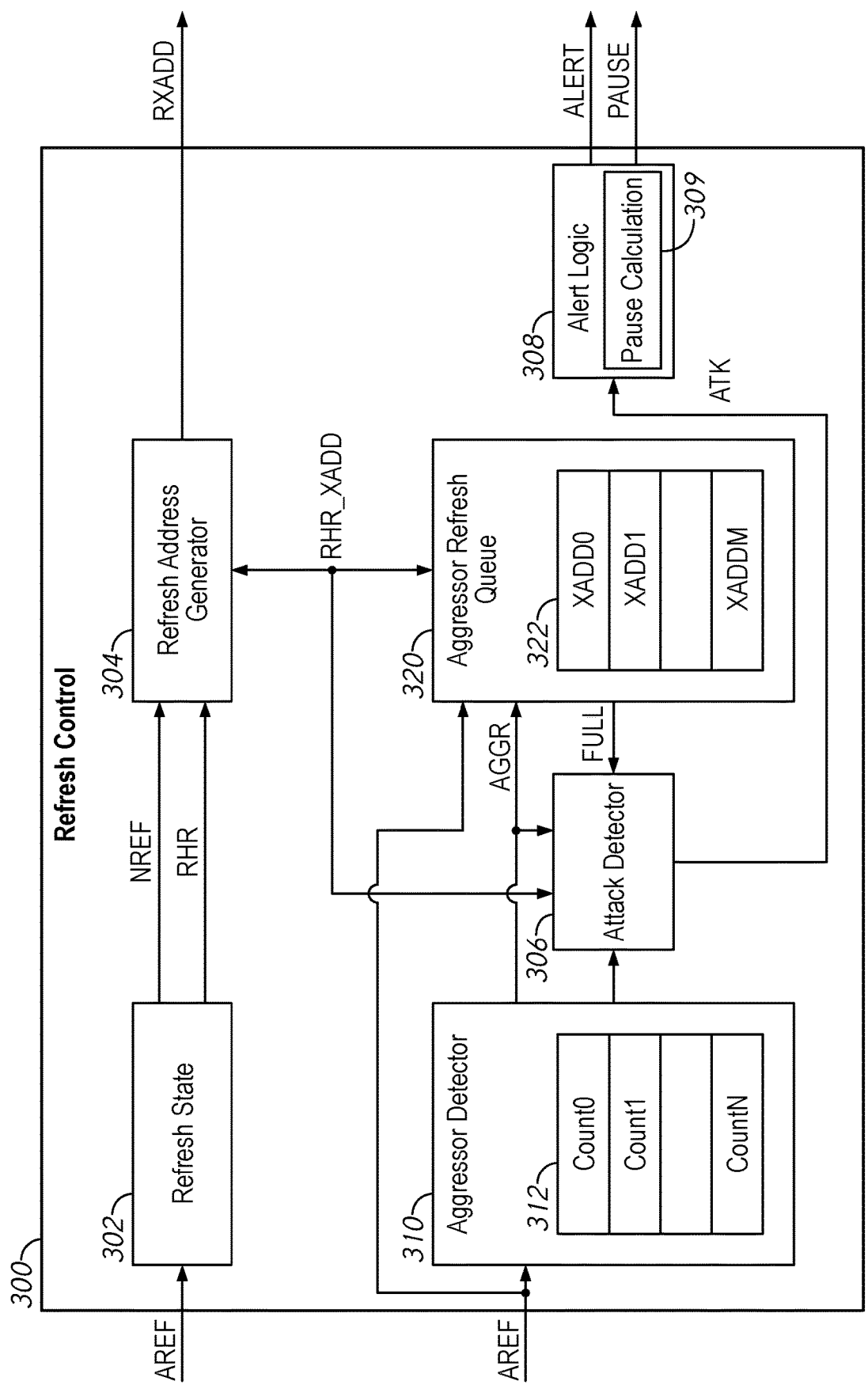
FIG. 3 is a block diagram of a refresh control circuit according to some embodiments of the present disclosure.

FIG. 3 is a block diagram of a refresh control circuit according to some embodiments of the present disclosure. The refresh control circuit 300 may, in some embodiments, be included in the refresh control circuit 112 of FIG. 1 and/or 222 of FIG. 2. The refresh control circuit 300 may provide a refresh address RXADD to be refreshed with timing based on a refresh signal AREF. The refresh control circuit 300 may determine if the refresh address RXADD is an auto-refresh address as part of an auto-refresh operation or a targeted refresh address based on an identified aggressor row. The refresh address RXADD may be provided to a row decoder (e.g., 224 of FIG. 2) which may refresh one or more word lines of the memory array associated with the refresh address RXADD. Various other signals (not shown) may also be provided in some embodiments to indicate details of the refresh operation to the row decoder.

The refresh control circuit 300 includes a refresh state control 302, which may manage the timing of various refresh operations. The refresh state control 302 may use perform a number of refresh operations responsive to each time an activation (e.g., pulse) of the signal AREF is received. For example, the refresh state control 302 may generate a number of refresh 'pumps' each of which is associated with a refresh operation. So, for example, an activation of AREF may cause four refresh pumps, and four refresh operations. Other numbers of pumps per activation of AREF may be used in other examples. In some embodiments, the number of pumps per activation of AREF may be variable.

Each pump may be associated with an auto-refresh operation, where word lines are refreshed as part of a refresh sequence, or a targeted refresh operation, where the victims of identified aggressor rows are refreshed. The refresh state control 302 may apportion pumps between the two operations based on various criteria. For example, if four pumps are provided per AREF activation, then two pumps may be used for auto-refresh operations and two may be used for targeted refresh operations. Other patterns may be used in other examples, and some patterns may span multiple activations of AREF. The refresh state control may provide pump signals NREF (to indicate an auto-refresh) and RHR (to indicate a targeted refresh) to a refresh address generator 304. In some embodiments, there may be a generic pump signal which is active for all pumps, and the state of an RHR signal may determine if the pump is used for an auto-refresh or targeted refresh signal.

The refresh address generator 304 may provide the refresh address RXADD. If the signal NREF is active, the refresh address generator 304 may provide an auto-refresh address based on an internal auto-refresh address generator. If the signal RHR is active, the refresh address generator 304 may generate the refresh address RXADD based on an aggressor address stored in an aggressor refresh queue 320. The auto-refresh addresses may be generated based on a sequence of addresses. For example, a first auto-refresh address may be provided and then a second auto-refresh address may be provided from a next entry in the sequence. In some embodiments, the sequence may be based on a numerical value of the refresh addresses. For example, the refresh address may be incremented to generate a next address in the sequence. In some embodiments, the refresh address may be associated with multiple word lines of the memory array, which may be refreshed simultaneously. For example, the row address may be truncated, and all rows which share the truncated row address in common may be refreshed together (e.g., a row in each different section of the memory). Other methods of generating the auto-refresh addresses may be used in other example embodiments.

The targeted refresh address may be based on a row address stored in the aggressor refresh queue 320. The aggressor refresh queue 320 may include a set of address registers 322, each of which stores a row address identified as an aggressor by the aggressor detector circuit 310. When a targeted refresh operation is called for (e.g., by the signal RHR being active) the refresh address generator 304 may retrieve an address RHR_XADD from one of the address registers 322. The aggressor refresh queue 320 may include logic which determines the order in which addresses are retrieved for refreshing.

The refresh address generator 304 may generate one or more refresh addresses RXADD based on the retrieved aggressor address. In some embodiments, the refresh addresses may include wordlines which are adjacent to the aggressor wordline (e.g., R+/−1). In some embodiments, the refresh addresses may include word lines further from the aggressor address (e.g., R+/−2). In some embodiments the refresh address generator 304 may refresh further away victims at a slower rate than the closer victims are refreshed.

The aggressor detector circuit 310 may receive a row address XADD along the row address bus. Based on the row addresses received overtime, the aggressor detector 310 may determine if a given address is an aggressor. The example aggressor detector 310 is shown as including a number of count values 312. The count values 312 may each represent accesses to one or more row addresses. For example, a given count value 312 may represent a number of times that a given row address has been provided along the row address bus. The aggressor detector 310 may compare the counts to a threshold value to determine if the address is an aggressor address. For example if the count value is greater than the threshold, then the row address(es) associated with that count value may be judged to be aggressors and may be stored in the aggressor refresh queue 320 so that their victims can be refreshed. When an aggressor is detected, the aggressor detector 310 may provide an aggressor signal AGGR at an active level, which may cause the aggressor refresh queue 320 to latch the value of the row address XADD off the row address bus and into one of the address registers 322.

In some embodiments, rather than respond to every row address across the row address bus, the refresh control circuit 300 may sample the value of the row address. The refresh control circuit 300 may include a sampling circuit which may activate a sampling signal with regular timing, random timing, timing based on one or more other signals, semi-random timing, pseudo-random timing, or combinations thereof. The aggressor detector 310 may respond to the row address when the sampling signal is active.

The refresh control circuit 300 may include an attack detector circuit 306 which may monitor the state of the refresh control circuit 300 to determine when an attack is occurring. When the attack detector 306 determines that an attack is in progress, it may provide an attack signal ATK at an active level. The attack signal may also indicate which type of attack is occurring in situations where the attack detector 306 detects more than one type of attack. In some embodiments, there may be multiple attack signals, each of which may be active to indicate that a different type of attack is occurring. An example attack detector is described in more detail in FIG. 4.

An example attack may include a waterfall attack, where the count values 312 are kept close to, but just below a hammer threshold that would cause the address(es) associated with that count value to be identified as an aggressor. Once a large number of the count values 312 are just below the hammer threshold, further accesses may be provided to push the count values 312 above the hammer threshold, which may be an overwhelming number of aggressor addresses, which the refresh control 300 may not be able to process in a timely manner. The attack detector may monitor the count values 312 and signal that a waterfall attack is occurring based on the count values 312. For example the attack detector may track a capacity count based on a number of the count values 312 which are above a first threshold which is smaller than the hammer threshold. When the capacity count rises above a second threshold, the attack detector 306 may signal that a waterfall type attack is occurring.

An example attack may include a refresh queue overflow attack. In such an attack, rows may be hammered quickly, such that the aggressor refresh queue 320 fills faster than it can be emptied. For example, if the address register 322 is storing a maximum number M different aggressor addresses, and the aggressor detector 310 provides the signal AGGR, then an address may be lost, since there are now M+1 identified aggressors. The attack detector 306 may monitor a state of the address registers 322 and may indicate that an overflow attack is occurring based on the state of the address registers 322. For example, the aggressor refresh queue 320 may provide a queue full signal FULL at an active level when the address register 322 is storing a maximum number of addresses. Responsive to another detected aggressor (e.g., the signal AGGR being active) while the signal FULL is active, the attack detector 306 may indicate that a refresh queue overflow attack is occurring.

The refresh control circuit 300 may include an alert logic circuit 308, which activates an alert signal ALERT and generates pause data PAUSE responsive to the attack signal ATK indicating that an attack is occurring. The alert logic circuit 308 may include a pause calculation circuit 309 (e.g., pause calculation circuit 119 of FIG. 1), which may generate the pause data PAUSE. The alert signal ALERT may be provided to an ALERT bus of the memory. The pause data PAUSE may be information which indicates a length of time that operations to the memory should be suspended. For example, the pause data PAUSE may be a binary number which specifies a number of clock cycles. The pause calculation circuit 309 may be a component of the alert logic 308, or may be a separate component which receives the attack signals ATK and provides the pause data PAUSE directly.

The pause calculation circuit 309 may generate different values of the pause data PAUSE responsive to which type of attack is indicated by the attack detector 306. For example, a first type of attack, such as a waterfall attack, may lead to a first value of the pause data PAUSE, while a second type of attack, such as a refresh queue overflow attack, may lead to a second value of the pause data PAUSE. In some embodiments, the value of PAUSE for a waterfall attack may be longer than the value of PAUSE for an overflow attack. In some embodiments, the pause calculation circuit 309 may also respond to a number of times that the attack signal (or an attack signal of a particular type) is provided. For example, if the signal indicating an overflow attack is provided a threshold number of times, the pause calculation circuit 309 may provide pause data PAUSE which is longer than the duration used when fewer overflow attacks are indicated. In some embodiments, if the overflow attack is detected above the threshold number of times, the pause calculation circuit 309 may set the pause data PAUSE to the same duration as if a waterfall attack had been detected. The pause data PAUSE may be stored in the memory for retrieval by the controller. In some embodiments, various other signals (e.g., ATK) may be provided to components of the memory to indicate that a suspension in operations is imminent.

In some embodiments, the refresh state control 302 may also respond to the detected attack (e.g., may respond to the signals ATK, ALERT, PAUSE, or combinations thereof) to enter the memory into a refresh mode while operations from the controller are suspended. For example, responsive to the attack detector 306 indicating a refresh queue overflow attack, the refresh state control circuit 302 may be entered into a refresh pattern where targeted refresh operations are performed until all of the addresses in the address registers 322 have their victims refreshed. The 'extra' address which triggered the overflow may also have its victims refreshed, as it may still be present along the row address bus. Responsive to the attack detector 306 indicating that a waterfall type attack is occurring, the refresh state control 302 may be entered into a mode where one or more of the address(es) associated with the counters 312 are refreshed. The refresh state control 302 may, for example, refresh every address associated with any counter 312 which is above the second threshold (e.g., close to the hammer threshold). In some embodiments, responsive to an attack the refresh state 302 may enter a mode where all word lines are refreshed. In some embodiments, the refresh state control 302 may enter a mode where more word lines are refreshed than are identified as aggressors (or are close to being identified as aggressors). In some embodiments, the refresh operations may take all or part of the time indicated by the pause data PAUSE.

Figure 4:
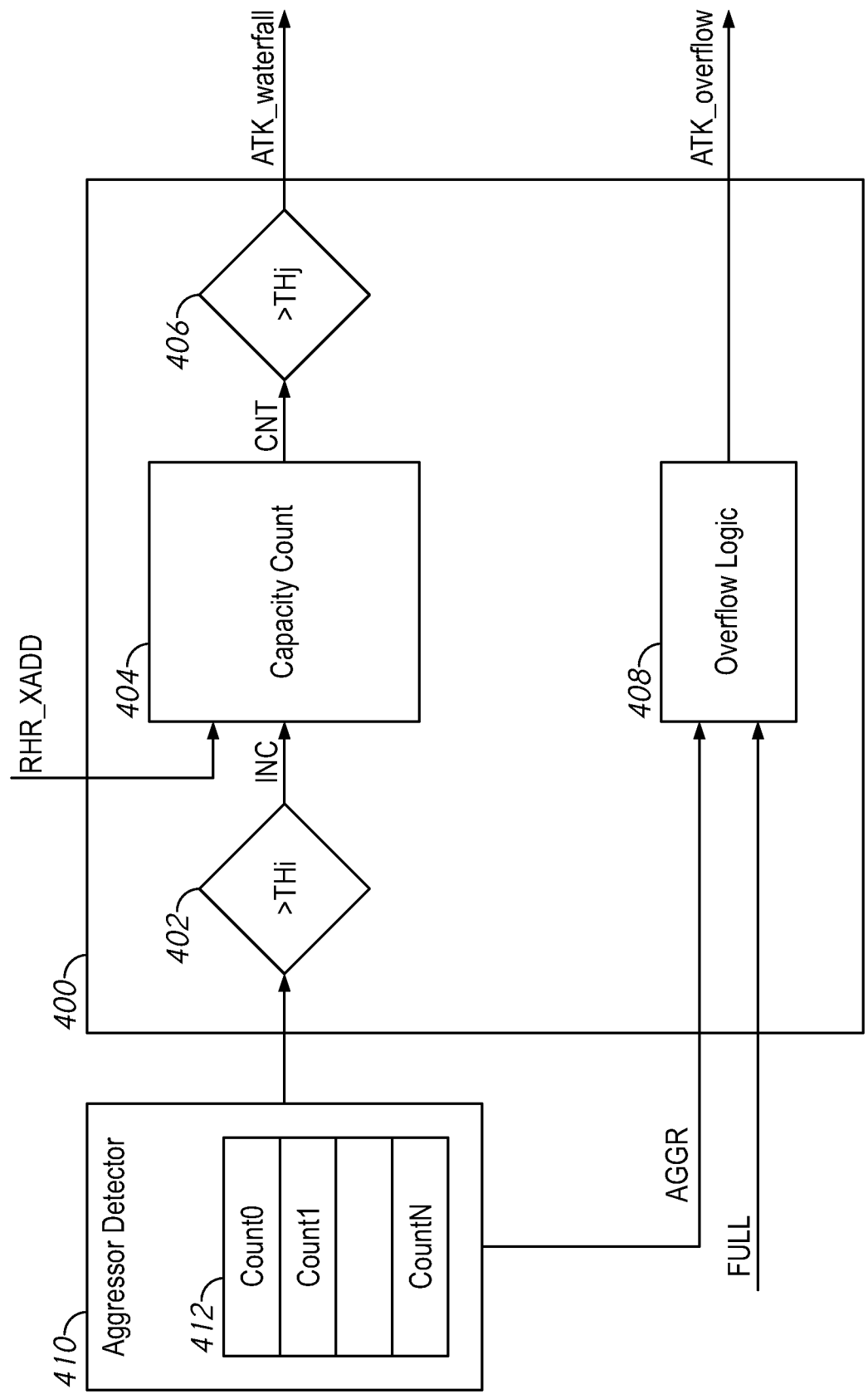
FIG. 4 is a block diagram of an attack detector circuit according to some embodiments of the present disclosure.

FIG. 4 is a block diagram of an attack detector circuit according to some embodiments of the present disclosure. The attack detector 400 may, in some embodiments, be included in the attack detector circuit 306 of FIG. 3. Also shown in FIG. 4 is an example aggressor detector 410, which may in some embodiments be included in the aggressor detector 310 of FIG. 3.

The attack detector 400 includes a first threshold comparator 402. The first threshold comparator 402 provides a signal INC at an active level for each of the count values 412 which is above a threshold THi. The threshold THi may be below a hammer threshold used to determine if a count value is associated with one or more aggressor addresses. For example, if the count values are 4001, 3988, 4996, and 2043, the hammer threshold may be 5000, the value of the threshold THi may be 4000, and the first comparator 402 may provide two activations of the signal INC. These values are for example only, and other values may be used in other example embodiments.

In some embodiments, the threshold THi used by the first comparator may be based on the way in which the count values 412 are stored. For example, the count values 412 may be stored as N-bit numbers. To simplify the operation of the first comparator 402, the first comparator may provide an activation of the signal INC any time the next-to-most-significant bit (e.g., the N-lth bit) first becomes a logical high for that count value.

Responsive to an activation of the signal INC, the capacity counter circuit 404 may change a value of a stored capacity count value CNT. For example, the attack counter circuit 404 may increment the capacity count value CNT. Responsive to an activation of the signal RHR_XADD, which represents that an address from the targeted refresh queue (e.g., 320) is being provided to the refresh address generator, the attack counter circuit 404 may change the value of CNT in a different direction. For example, the attack counter circuit 404 may decrease the value CNT responsive to an activation of RHR_XADD. In some embodiments, the value CNT may be decreased by an amount based on one or more threshold values (e.g., THi, THj, and/or the hammer threshold) responsive to signal RHR_XADD.

In some embodiments, the attack counter 404 may store multiple count values (e.g., CNT0, CNT1, etc.) which may be used to determine the value of the overall capacity count value CNT. For example, the attack counter 404 may periodically switch between using the signals INC and RHR_XADD to change a first count value CNT0 and a second value CNT1. The overall count value CNT may then be a difference between CNT0 and CNT1, and may represent a change in the count value in a given period of time (e.g., the period over which the attack counter 404 switches count values).

The capacity count value CNT may be provided to a second threshold comparator 406, which may compare the count value CNT to a second threshold THj. If the count value CNT is greater than the second threshold THj, then the second comparator 406 may provide an attack signal ATK_waterfall at an active level, which indicates that a waterfall attack is occurring. The signal ATK_waterfall may be reset to an inactive level when the operations to the memory are suspended, and/or when the memory is refreshed to a point that the count value CNT is no longer above the threshold value THj.

The attack detector 400 may also monitor for overflow attacks. For example, an overflow logic circuit 408 may monitor the signals FULL and AGGR from the targeted refresh queue (e.g., 320 of FIG. 3) and the aggressor detector 410. The signal FULL may be active when all of the address registers of the targeted refresh queue 320 are all storing an unrefreshed aggressor address. The signal AGGR may be active when a new aggressor address is identified. Responsive to both signals being active, the overflow logic 408 may provide a signal ATK_overflow at an active level, which may indicate that an overflow attack is occurring. In some embodiments, the overflow logic 408 may be an AND gate.

In some embodiments, one or more of the threshold values THi, THj and/or the hammer threshold may be a pre-set value of the memory, a programmable value, or combinations thereof. In some embodiments, one or more of the threshold values may be varied over time. For example, the memory may include a random number generator (or some other source of randomness) which may periodically change the values of one or more of the threshold values. This randomness may make it more difficult to predict the behavior of the memory during an attack.

In some embodiments, the attack detector 400 may also trigger an attack signal based on the number and/or rate at which attacks are detected. For example, the attack detector 400 may count a number of times the ATK_overflow signal is activated. The overflow count may be periodically reset. In this manner, the overflow count may act as a measure of the rate at which overflow attacks are detected. If the overflow count rises above a threshold, the attack detector may trigger an attack signal, which may be associated with pause data of longer duration than the pause data normally triggered by the activation of ATK_overflow. In some embodiments, to simplify signaling, the overflow count rising above the threshold may lead to an activation of the signal ATK_waterfall.

Figure 5:
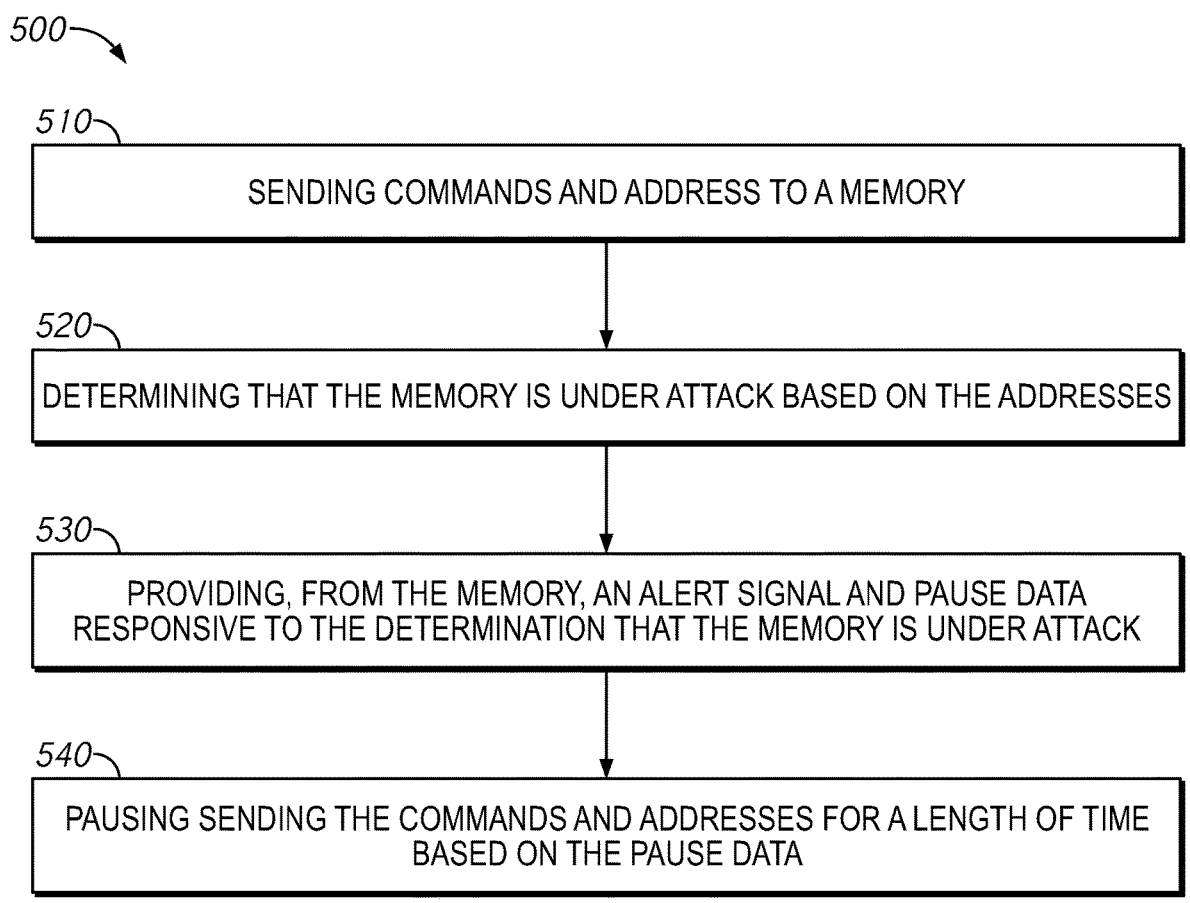
FIG. 5 is a flow chart of a method of detecting attacks and pausing operations according to some embodiments of the present disclosure.

FIG. 5 is a flow chart of a method of detecting attacks and pausing operations according to some embodiments of the present disclosure. The method 500 may, in some embodiments, be performed by one or more of the systems, apparatuses, and/or components described in one or more of FIGS. 1-4. While certain steps and operations are shown in the method 500, it should be appreciated that other example methods may include different steps, may include steps performed in a different order, may include repeated steps, or combinations thereof.

The method 500 may include block 510 which describes sending commands and addresses to a memory. A controller (e.g., 102 of FIG. 1) may send commands and addresses along a command address CA bus. The commands and addresses may be associated with access operations on the memory. The commands may specify a type of operation to be performed, and the addresses may specify one or more memory cells associated with that operation. For example, a row address may specify a row of the memory, a column address may specify a column of the memory, and a bank address may specify a bank of the memory.

Block 510 may generally be followed by block 520, which describes determining that the memory is under attack based on the addresses. The attack may be a deliberate attack (e.g., caused by a malicious actor) or may be an inadvertent attack (e.g., caused by operations which were not deliberately meant to cause problems in the memory). The memory may include an attack detector circuit which may monitor the commands and/or addresses received by the memory to determine if one or more types of attack is occurring.

The attack detector may determine if a queue overflow attack is occurring. The memory may identify aggressor addresses. For example, the memory may count accesses to various row addresses, and check to see if any of the counts has risen above a hammer threshold. The memory may store the identified aggressor addresses, for example in a targeted refresh queue. The queue may provide a full signal at an active level when the number of stored identified aggressor addresses rises above a threshold. In some embodiments, the threshold may represent a maximum capacity of the targeted refresh queue. When an additional address would be stored in the queue (e.g., based on identifying a new aggressor address), and the full signal is at the active level, the attack detector may determine that an overflow attack is occurring.

The attack detector may determine if a waterfall attack is occurring. The memory may change selected ones of a plurality of count values (e.g., 312 of FIG. 3) based on the received addresses. The attack detector may determine a capacity count based on a number of the plurality of count values which are above a first threshold. The attack detector may determine that a waterfall attack is occurring based on the capacity count rising above a second threshold.

Block 520 may generally be followed by block 530, which describes providing, from the memory, an alert signal and pause data responsive to the determination that the memory is under attack. The alert signal may indicate that a problem is occurring in the memory. The controller may perform a read operation to retrieve the pause data. In some embodiments, where multiple memories are coupled to the same controller, the controller may also determine which memory is under attack. The alert signal may be provided along an alert bus (e.g., an alert pin). The pause data may be provided along a data bus. For example, the controller may perform a read operation to retrieve the pause data responsive to the alert signal.

Block 530 may generally be followed by block 540 which describes pausing sending the commands and addresses for a length of time based on the pause data. The pause data may specify a length of time (e.g., in clock cycles). The controller may suspend operations to the memory for the length of time specified in the pause data. The memory may take into account the type of attack detected when setting the length of time which is specified by the pause data. For example, the pause data generated responsive to an overflow attack may specify a shorter duration than the pause data generated responsive to a waterfall attack.

While the commands and addresses are paused, the memory may enter a refresh mode in order to refresh word lines of the memory. For example, the memory may refresh enough word lines associated with the type of attack which was detected. In some embodiments, the length of time specified by the pause data may be based, in part, on the length of time it will take to perform the refreshing.

It is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. A system comprising:
a controller configured to provide commands and addresses along a command address bus; and
a memory configured to monitor the addresses and based on the monitored addresses provide an alert signal along an alert bus and provide pause data along a data bus,
wherein responsive to the alert signal and the pause data, the controller is configured to stop providing the commands and the addresses to the memory for a length of time specified by the pause data, wherein the pause data includes a number which specifies the length of time.

2. The system of claim 1, wherein the memory comprises a refresh control circuit configured to store a plurality of count values each associated with one or more of the provided addresses and configured to store selected ones of the provided addresses in a targeted refresh queue based on the count value associated with the selected ones of the provided addresses being above a hammer threshold.

3. The system of claim 2, wherein the refresh control circuit is further configured to store a second count value based on a number of the plurality of count values which are above a first threshold, different than the hammer threshold, and wherein the memory is configured to provide the alert signal and the pause data responsive to the second count value rising above a second threshold.

4. The system of claim 2, wherein the memory is configured to provide the alert signal and the pause data responsive to the targeted refresh queue being full, and an additional one of the provided addresses needing to be stored in the targeted refresh queue.

5. The system of claim 1, wherein responsive to receiving the alert signal, the controller performs a read operation on the memory to retrieve the pause data.

6. The system of claim 1, wherein the memory is configured to enter a self-refresh mode after providing the alert signal and the pause data.

7. The system of claim 1, wherein the memory comprises a plurality of banks, and wherein the alert signal and the pause data are associated with a selected one of the plurality of banks, and wherein responsive to the alert signal and the pause data the controller is configured to stop sending the commands and the addresses to the selected one of the plurality of banks, while still sending the commands and the addresses to others of the plurality of banks.

8. An apparatus comprising:
a refresh queue configured to store a plurality of addresses, wherein the refresh queue is configured to provide a full signal at an active level when a number of the plurality of addresses is above a threshold;
an attack detector configured to provide an attack signal responsive to receiving a next address to be stored when the full signal is at the active level; and
alert logic configured to provide an alert signal at an active level to an alert terminal and pause data to a data terminal responsive to the attack signal at the active level, wherein the pause data includes a number which specifies an amount of time.

9. The apparatus of claim 8, further comprising an aggressor detector circuit comprising a plurality of count values, each associated with one or more addresses, wherein the attack detector is configured to count a number of the plurality of count values which are above a first threshold, and wherein when the number is above a second threshold, the attack detector is configured to provide the attack signal at the active level.

10. The apparatus of claim 9, wherein the alert logic is configured to generate a first value of the pause data responsive to the attack signal being at the active level based on receiving the next address when the full signal is at the active level, and configured to generate a second value of the pause data responsive to the attack signal being at the active level based on the number being above the second threshold.

11. The apparatus of claim 8, further comprising a refresh state control circuit configured to refresh victim word lines associated with the plurality of addresses in the refresh queue and the next address responsive to a pause in operations based on the alert signal at the active level and the pause data.

12. The apparatus of claim 8, wherein the number in the pause data specifies an amount of time that the memory wants operations from a controller to be suspended for.

13. The apparatus of claim 8, further comprising a pause calculation circuit configured to generate the pause data responsive to the attack signal.

14. The apparatus of claim 13, wherein the pause calculation circuit is configured to set a value of the pause data responsive to a type of the attack signal, a number of times the attack signal has been provided, or combinations thereof.

15. An apparatus comprising:
an aggressor detector circuit configured to store a plurality of count values, each associated with accesses to one or more row addresses;
an attack detector circuit configured to store a capacity count based on a number of the plurality of count values which are above a threshold;
a comparator circuit configured provide an attack signal at an active level based on a value of the capacity count;
an alert logic circuit configured to provide pause data to data terminals and an alert signal to an alert terminal responsive to the attack signal at the active level.

16. The apparatus of claim 15, further comprising a refresh queue configured to store a plurality of aggressor addresses, wherein the refresh queue is configured to provide a full signal at an active level responsive to a number of the plurality of aggressor addresses exceeding a threshold, and wherein the attack detector circuit is further configured to provide a second attack signal at an active level responsive to receiving a next address to be stored when the full signal is at the active level.

17. The apparatus of claim 16, wherein the alert logic is configured to generate a first value of the pause data responsive to the attack signal being active and a second value of the pause data responsive to the second attack signal being active.

18. The apparatus of claim 16, wherein the capacity count is changed in a first direction responsive to one of the plurality of count values rising above the threshold and changed in a second direction responsive to one of the plurality of aggressor addresses being provided for refreshing.

19. The apparatus of claim 15, wherein the comparator circuit is configured to provide the attack signal at the active level responsive to the capacity count being above a second threshold value.

20. The apparatus of claim 15, further comprising a refresh state control circuit configured to refresh the victims of any word lines associated with one of the stored plurality of count values which is over the threshold responsive to a pause in operations based on the alert signal at the active level and the pause data.

21. The apparatus of claim 15, wherein the attack detector comprises a first count value and a second count value, each of which is changed based on the which of the plurality of count values is above the threshold in different time periods, and wherein the capacity count is based on a difference between the first count value and the second count value.

22. The apparatus of claim 15, further comprising a pause calculation circuit configured to generate the pause data responsive to the attack signal at the active level.

23. A method comprising:
sending commands and addresses to a memory;
determining that the memory is under attack based on the addresses;
providing, from the memory, an alert signal and pause data responsive to the determination that the memory is under attack, wherein the pause data includes a number;
pausing sending the commands and addresses for a length of time specified by the number in the pause data.

24. The method of claim 23, further comprising:
identifying aggressor addresses
storing the aggressor addresses;
providing a full signal at an active level when the number of stored address is above a threshold; and
determining that the memory is under attack based on identifying an aggressor address when the full signal is at the active level.

25. The method of claim 23, further comprising:
changing selected ones of a plurality of counts based on the addresses;
determining a capacity count based on a number of the plurality of counts which are above a first threshold; and
determining that the memory is under attack based on the capacity count rising above a second threshold.

26. The method of claim 23, further comprising:
determining a type of attack; and
setting a length of time specified by the pause data based on the type of the attack.

27. The method of claim 23, further comprising entering the memory into a refresh mode while the commands and addresses are paused.

28. The method of claim 23, further comprising reading the pause data along a data bus responsive to the alert signal at the active level.

29. The method of claim 23, further comprising pausing sending the commands and addresses to selected banks of the memory while continuing sending the commands and the addresses to other banks of the memory.

* * * * *